US012646462B2

(12) United States Patent
Guo

(10) Patent No.: US 12,646,462 B2
(45) Date of Patent: Jun. 2, 2026

(54) DISPLAY PANEL AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventor: Yonglin Guo, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 18/996,130

(22) PCT Filed: Mar. 26, 2024

(86) PCT No.: PCT/CN2024/083787
§ 371 (c)(1),
(2) Date: Jan. 17, 2025

(87) PCT Pub. No.: WO2024/208023
PCT Pub. Date: Oct. 10, 2024

(65) Prior Publication Data
US 2026/0051291 A1     Feb. 19, 2026

(30) Foreign Application Priority Data

Apr. 3, 2023   (CN) ......................... 202310348033.4

(51) Int. Cl.
$G09G\ 3/3233$     (2016.01)
$H10K\ 59/131$     (2023.01)

(52) U.S. Cl.
CPC ......... $G09G\ 3/3233$ (2013.01); $H10K\ 59/131$ (2023.02); $G09G\ 2300/0426$ (2013.01);
(Continued)

(58) Field of Classification Search
CPC ........................... G09G 3/3233; H10K 59/131
(Continued)

(56) References Cited

U.S. PATENT DOCUMENTS 11,074,864 B1     7/2021  Lu et al.
2014/0028733 A1     1/2014  Lee et al.
(Continued)

FOREIGN PATENT DOCUMENTS

CN          1432984  A     7/2003
CN          1521712  A     8/2004
(Continued)

OTHER PUBLICATIONS

First Office Action dated Dec. 12, 2025 received in Chinese Patent Application No. 202310348033.4.

*Primary Examiner* — Calvin C Ma
(74) *Attorney, Agent, or Firm* — Scully, Scott, Murphy & Presser, P.C.

(57) ABSTRACT

A display panel and a display apparatus are provided. In the display panel, a first electrode of the threshold compensation transistor is connected to a first electrode of the driving transistor, a second electrode of the threshold compensation transistor is connected to a gate electrode of the driving
(Continued)

100 transistor, and the data writing transistor is connected to a second electrode of the driving transistor, a material of an active layer of the threshold compensation transistor includes low-temperature poly-silicon, the gate line and the scan line are arranged along a second direction, the second direction intersects with the first direction, the gate line is different from the scan line, an active layer of the data writing transistor is located on a side of an active layer of the driving transistor away from the active layer of the threshold compensation transistor in the second direction.

20 Claims, 28 Drawing Sheets

(52) U.S. Cl.
CPC ............... *G09G 2300/0819* (2013.01); *G09G 2300/0842* (2013.01); *G09G 2300/0861* (2013.01); *G09G 2320/0242* (2013.01); *G09G 2320/0247* (2013.01); *G09G 2360/16* (2013.01)

(58) Field of Classification Search
USPC ......................................................... 345/204
See application file for complete search history.

(56) References Cited

U.S. PATENT DOCUMENTS

| | | | |
|---|---|---|---|
| 2022/0343823 A1 | 10/2022 | Wang et al. | |
| 2023/0070413 A1* | 3/2023 | Xu ...................... | H10D 30/6755 |
| 2023/0215314 A1* | 7/2023 | Ke ......................... | H10K 59/00 |
| | | | 345/443 |
| 2024/0087518 A1* | 3/2024 | He ........................ | G09G 3/3266 |
| 2025/0191523 A1* | 6/2025 | Zhang .................. | G09G 3/3266 |

FOREIGN PATENT DOCUMENTS

| | | | |
|---|---|---|---|
| CN | 1170261 | C | 10/2004 |
| CN | 1564318 | A | 1/2005 |
| CN | 1567412 | A | 1/2005 |
| CN | 111243510 | A | 6/2020 |
| CN | 113629127 | A | 11/2021 |
| CN | 113674693 | A | 11/2021 |
| CN | 114093299 | A | 2/2022 |
| CN | 114093898 | A | 2/2022 |
| CN | 114222615 | A | 3/2022 |
| CN | 114361186 | A | 4/2022 |
| CN | 114830216 | A | 7/2022 |
| CN | 116312373 | A | 6/2023 |
| WO | 2021189331 | A1 | 9/2021 |
| WO | 2022082751 | A1 | 4/2022 |

* cited by examiner

M0

LY2

INT2/INT21
INT1/INT11

LY3

M0+LY1+LY2+VH1+LY3

M0+LY1+LY2+VH1+LY3+VH2+LY4+VH3+LY5+PDL

LY44VH3

PL1/PL12/MP          PL1/PL12          PL1/PL12/MP          PL1/PL12

FT/CEn          BR          Vm

CEm

Y

X          DT          DT          DT          DT

Vn

LY44LY5

PL1/PL12/MP          PL1/PL12          PL1/PL12/MP          PL1/PL12

BR

FT/CEn

E1

CEm

Y

X          DT          DT          DT          DT

M0+LY1+LY5

M0+LY1+LY2+VH1+LY4+VH3

M0+LY1+LY2+VH1+LY4+LY5+PDL

M0+LY1+LY5

M0+LY1+LY2+VH1+LY3+VH2+LY4+VH3+LY5+PDL

M0+LY1+LY2+VH1+LY3+VH2+LY4+VH3+LY5+PDL

M0+LY5

DISPLAY PANEL AND DISPLAY APPARATUS

CROSS-REFERENCE TO RELATED APPLICATION

The subject application is a national phase entry of PCT International Application No. PCT/CN2024/083787, filed on Mar. 26, 2024, which claims priority to Chinese Patent Application No. 202310348033.4, filed on Apr. 3, 2023. The entire disclosure of each of PCT International Application No. PCT/CN2024/083787 and Chinese Patent Application No. 202310348033.4 is incorporated herein by this reference.

TECHNICAL FIELD

At least one embodiment of the present disclosure relates to a display panel and a display apparatus.

BACKGROUND

With the continuous development of display technology, active-matrix organic light-emitting diode (AMOLED) display technology has been widely used in display apparatuses, such as mobile phones, tablet computers, digital cameras, etc., due to the advantages of self-luminescence, wide viewing angle, high contrast, low power consumption and high response speed, etc.

SUMMARY

At least one embodiment of the present disclosure relates to a display panel and a display apparatus, in order to avoid or alleviate display defects, such as afterimage and smearing, etc.

At least one embodiment of the present disclosure provides a display panel, including: a base substrate; a pixel circuit, located on the base substrate, and including a driving transistor, a threshold compensation transistor and a data writing transistor; a gate line, connected to a gate electrode of the threshold compensation transistor, and extending along a first direction; and a scan line connected to a gate electrode of the data writing transistor, and extending along the first direction; a first electrode of the threshold compensation transistor is connected to a first electrode of the driving transistor, a second electrode of the threshold compensation transistor is connected to a gate electrode of the driving transistor, and the data writing transistor is connected to a second electrode of the driving transistor, a material of an active layer of the threshold compensation transistor includes low-temperature poly-silicon, the gate line and the scan line are arranged along a second direction, the second direction intersects with the first direction, the gate line is different from the scan line, an active layer of the data writing transistor is located on a side of an active layer of the driving transistor away from the active layer of the threshold compensation transistor in the second direction.

For example, the gate line and the scan line are disposed on both sides of the active layer of the driving transistor, respectively.

For example, the display panel further includes a light-emitting element, the pixel circuit is configured to drive the light-emitting element, the pixel circuit further includes a first reset transistor connected to the gate electrode of the driving transistor; the light-emitting element includes a first electrode, a second electrode, and a light-emitting functional layer located between the first electrode and the second electrode, and the first electrode of the light-emitting element is closer to the base substrate than the second electrode of the light-emitting element.

For example, an orthographic projection of the first electrode of the light-emitting element on the base substrate overlaps with an orthographic projection of an active layer of the first reset transistor on the base substrate, and the orthographic projection of the first electrode of the light-emitting element on the base substrate overlaps with an orthographic projection of the active layer of the threshold compensation transistor on the base substrate.

For example, the orthographic projection of the first electrode of the light-emitting element on the base substrate covers an orthographic projection of at least one of the first active layer and the second active layer on the base substrate.

For example, an active layer of the first reset transistor includes a first channel and a second channel, the first channel and the second channel are connected through a first conductive portion, the active layer of the threshold compensation transistor includes a third channel and a fourth channel, and the third channel and the fourth channel are connected through a second conductive portion.

For example, the orthographic projection of the first electrode of the light-emitting element on the base substrate covers an orthographic projection of at least one of the first conductive portion and the second conductive portion on the base substrate.

For example, the orthographic projection of the first electrode of the light-emitting element on the base substrate overlaps with an orthographic projection of the first conductive portion on the base substrate, and the orthographic projection of the first electrode of the light-emitting element on the base substrate overlaps with an orthographic projection of the second conductive portion on the base substrate.

For example, the display panel further includes a light-emitting control signal line, the pixel circuit further includes a first light-emitting control transistor, an orthographic projection of the light-emitting control signal line on the base substrate overlaps with an orthographic projection of an active layer of the first light-emitting control transistor on the base substrate, the first light-emitting control transistor and the data writing transistor are connected through a first conductive connection component, and an orthographic projection of the light-emitting control signal line on the base substrate overlaps with an orthographic projection of the first conductive connection component on the base substrate.

For example, the first conductive connection component and the active layer of the first light-emitting control transistor are located in different layers.

For example, one end of the first conductive connection component is connected to the data writing transistor through a first via hole, and the other end of the first conductive connection component is connected to the first light-emitting control transistor through a second via hole.

For example, the first via hole is located between the light-emitting control signal line and the scan line.

For example, the orthographic projection of the light-emitting control signal line on the base substrate does not overlap with an orthographic projection of the data writing transistor on the base substrate.

For example, the display panel further includes a storage capacitor and a first power line, a first electrode plate of the storage capacitor is connected to the gate electrode of the driving transistor, a second electrode plate of the storage capacitor is connected to the first power line, and the first power line is configured to provide a first power voltage to the pixel circuit.

For example, an orthographic projection of the first power line on the base substrate overlaps with the orthographic projection of the active layer of the first reset transistor on the base substrate, and overlaps with the orthographic projection of the active layer of the threshold compensation transistor on the base substrate.

For example, the first power line includes a first conductive line and a second conductive line, the first conductive line is closer to the base substrate than the second conductive line, and the first conductive line is connected to the second conductive line.

For example, the second conductive line includes a first protrusion protruding along the first direction, and an orthographic projection of the first protrusion on the base substrate overlaps with an orthographic projection of at least one of a first channel and a second channel of the active layer of the first reset transistor on the base substrate.

For example, a plurality of first conductive lines are arranged along the first direction, and at least one first conductive line includes a plurality of sub-lines disconnected along the second direction, and the second direction intersects with the first direction.

For example, the display panel further includes a first initialization line and a second initialization line, the pixel circuit further includes a second reset transistor, the second reset transistor is connected to the first electrode of the light-emitting element, the first initialization line is connected to the first reset transistor, the second initialization line is connected to the second reset transistor, the first initialization line includes a first initialization signal line extending along the first direction and a first initialization connection line extending along the second direction, the second initialization line includes a second initialization signal line extending along the first direction and a second initialization connection line extending along the second direction, and the first initialization connection line, the first conductive line and the second initialization connection line are sequentially arranged adjacent to each other along the first direction.

For example, the first initialization connection line includes a second conductive connection component, the first initialization signal line and the first reset transistor are connected through the second conductive connection component, and the second conductive connection component is located between two adjacent sub-lines.

For example, the second conductive line has a main portion and a branch portion, the branch portion is branched from the main portion, the orthographic projection of the first electrode of the light-emitting element on the base substrate overlaps with an orthographic projection of the main portion on the base substrate, and overlaps with an orthographic projection of the branch portion on the base substrate.

For example, the display panel further includes a flattening element, the orthographic projection of the first electrode of the light-emitting element on the base substrate overlaps with an orthographic projection of the flattening element on the base substrate, and the flattening element and the branch portion are disposed on both sides of the main portion, respectively.

For example, the flattening element and the main portion are in a same layer and arranged at intervals, the flattening element extends along the second direction, and the flattening element is connected to the first electrode of the light-emitting element through a third via hole.

For example, a width of the main portion is greater than a width of the branch portion, and is greater than a width of the flattening element in the first direction.

For example, the first initialization signal line has a block, and an orthographic projection of a conductive portion connected to two channels arranged at intervals in the active layer of the threshold compensation transistor on the base substrate overlaps with an orthographic projection of the block on the base substrate.

For example, the first electrode of the light-emitting element has a second protrusion, and an orthographic projection of the second protrusion on the base substrate overlaps with an orthographic projection of at least one of an active layer of the first reset transistor and the active layer of the threshold compensation transistor on the base substrate.

For example, the display panel further includes a block, the first conductive line and the block are connected through a fourth via hole, and an orthographic projection of a conductive portion connected to two channels arranged at intervals in the active layer of the threshold compensation transistor on the base substrate overlaps with an orthographic projection of the block on the base substrate.

At least one embodiment of the present disclosure provides a display apparatus, including any one of the display panels as described above.

BRIEF DESCRIPTION OF DRAWINGS

In order to more clearly illustrate the technical solution of the embodiments of the present disclosure, the drawings of the embodiments will be briefly described in the following. Apparently, the described drawings in the following are only related to some embodiments of the present disclosure without any limitation to the present disclosure.

DETAILED DESCRIPTION

In order to make objectives, technical details, and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the words such as "a", "an" or "the" do not indicate a quantity limit, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

In a common AMOLED display panel, the data writing transistor and the threshold compensation transistor share the same control line, and the driving transistor is prone to hysteresis, resulting in display defects such as afterimages and smearing, etc.

In the display panel provided by some embodiments of the present disclosure, the data writing transistor and the threshold compensation transistor adopt different control lines.

The AMOLED display panel includes a plurality of pixels, each pixel includes a plurality of sub-pixels, each sub-pixel includes a pixel circuit and a light-emitting element, and the pixel circuit provides a driving current to drive the light-emitting element to emit light. In some AMOLED display panels, such as mobile phones, it is found that when displaying, the display panel may turn red due to strong illumination and may flicker due to illumination.

Figure 1:
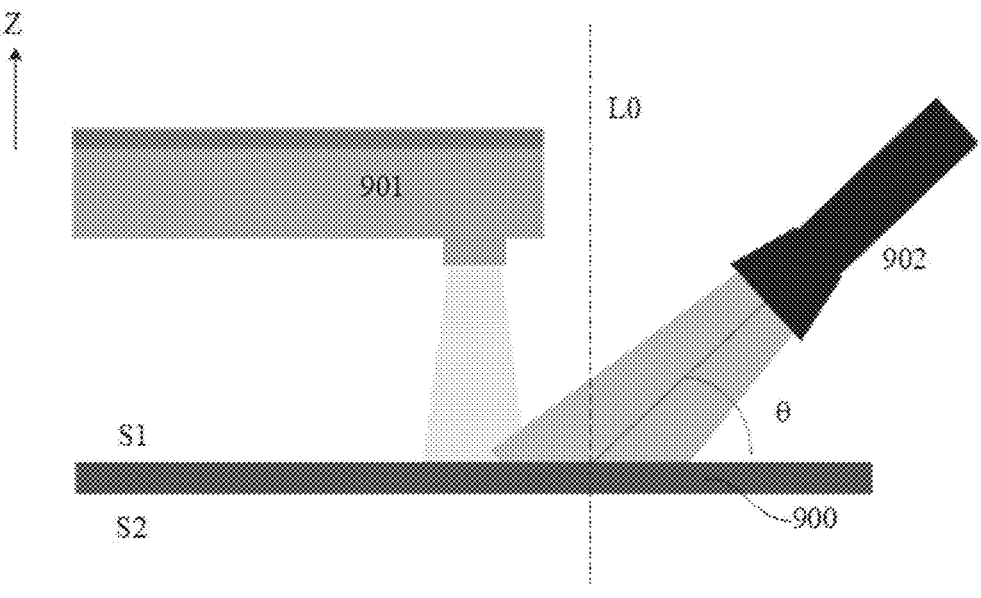
FIG. 1 is a schematic diagram of a display panel irradiated by strong light.
Figure 2:
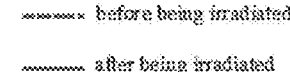
FIG. 2 shows brightness waveform curves of a display panel before and after being irradiated.
Figure 2:
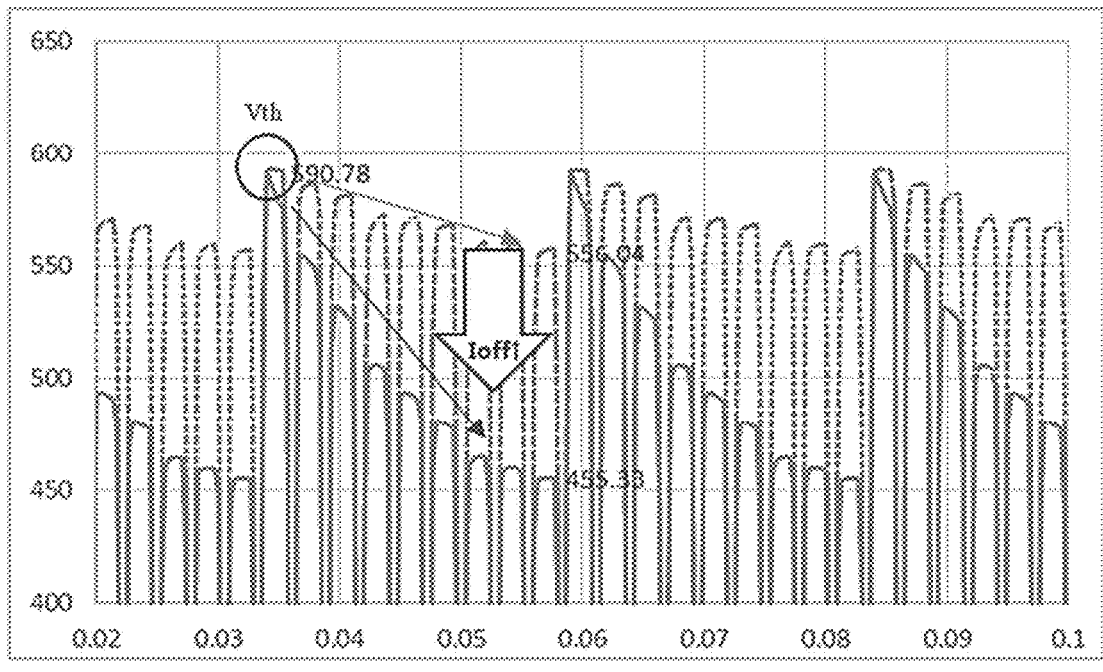
Figure 3:
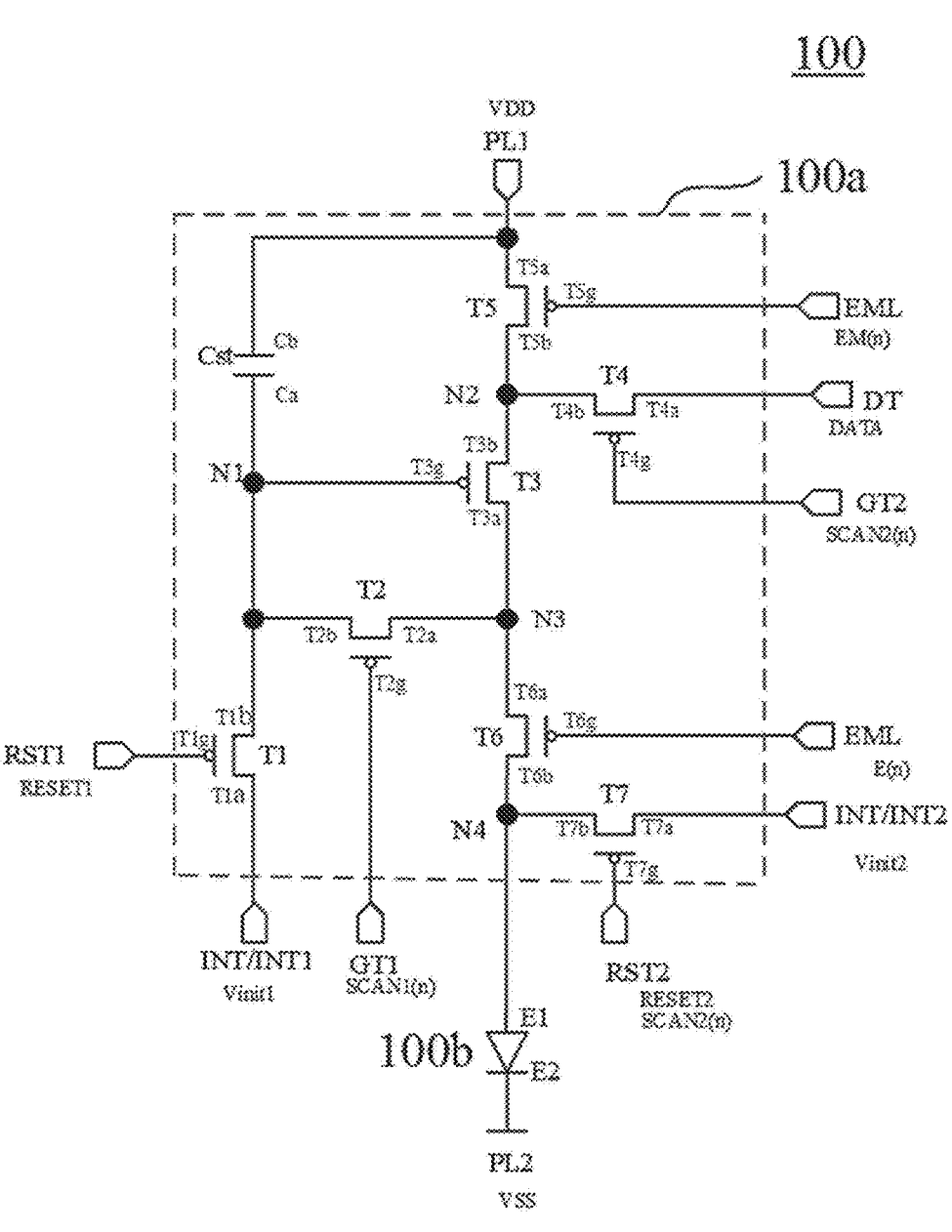
FIG. 3 is a schematic diagram of a pixel circuit and a light-emitting element in a sub-pixel of a display panel.

FIG. 1 is a schematic diagram of a display panel irradiated by strong light. FIG. 2 shows brightness waveform curves of a display panel before and after being irradiated. FIG. 3 is a schematic diagram of a pixel circuit and a light-emitting element in a sub-pixel of a display panel.

As shown in FIG. 1, the display panel 900 has a display side S1 and a counter side S2, and the counter side S2 is the opposite side of the display side S1.

As shown in FIG. 1, on the display side S1 of the display panel 900, a strong light source 902 irradiates the display panel 900, and the included angle between the light of the strong light source 902 and the normal line L0 of the display panel 900 is an included angle θ, and the shooting direction of a shooting component 901 is perpendicular to the display panel 900, and the entire display panel 900 is shot. Some display panels, when irradiated by strong light, are prone to problems such as turning red and flickering, etc.

As shown in FIG. 1, the included angle θ may be 45 degrees. In the embodiment of the present disclosure, when strong light irradiates the display panel, the included angle θ is 45 degrees in the case of oblique light. If the included angle θ is 90 degrees, that is, the included angle between the light of the strong light source 902 and the normal line of the display panel 900 is 90 degrees, then the strong light source 902 irradiates the display panel 900 on the display side S1, which is the case of top light irradiation. On the other hand, if the included angle θ is 90 degrees, the strong light source 902 irradiates the display panel 900 on the counter side S2, which is the case of bottom light irradiation. For example, when performing top light irradiation or bottom light irradiation, the light intensity can be 10000 nit. For example, in the case of oblique light, the strong light source 902 can be a flashlight, but it is not limited thereto.

As shown in FIG. 3, the display panel includes a plurality of sub-pixels 100. FIG. 3 shows one sub-pixel 100. As shown in FIG. 3, each sub-pixel 100 includes a pixel circuit 100a and a light-emitting element 100b. The pixel circuit 100a drives the light-emitting element 100b. The pixel circuit 100a drives the light-emitting element 100b to emit light. The pixel circuit 100a provides a driving current to drive the light-emitting element 100b to emit light. The pixel circuit shown in FIG. 3 can be a pixel circuit of low-temperature poly-silicon (LTPS) AMOLED which is common in the related art.

As shown in FIG. 3, the pixel circuit 100a includes six switching transistors (T1-T2, T4-T7), a driving transistor T3 and a storage capacitor Cst. The six switching transistors are respectively a data writing transistor T4, a threshold compensation transistor T2, a light-emitting control transistor T5, a light-emitting control transistor T6, a reset transistor T1 and a reset transistor T7. The light-emitting element 100b includes a first electrode E1 and a second electrode E2, and a light-emitting functional layer located between the first electrode E1 and the second electrode E2. For example, the first electrode E1 is an anode and the second electrode E2 is a cathode. FIG. 3 shows a node N1, a node N2, a node N3 and a node N4.

The pixel circuit includes a driving transistor, and the threshold voltage Vth and leakage current Ioff of the driving transistor are important parameters related to the display effect.

Table 1 shows the changes of lighting characteristics of light-emitting elements in display panels. As can be seen from Table 1, the threshold voltage Vth of the driving transistor changes little before and after being irradiated, but the leakage current Ioff deteriorates seriously.

TABLE 1

| Changes of Lighting Characteristics of Light-Emitting Elements in Display Panels | | | | | |
|---|---|---|---|---|---|
| | | DIS-PLAY PANEL 1 | DIS-PLAY PANEL 2 | DIS-PLAY PANEL 3 | DIS-PLAY PANEL 4 |
| THRESH-OLD VOLT-AGE | ORIGINAL VALUE | −2.10 | −0.71 | −3.21 | −2.07 |
| | TOP LIGHT | −2.52 | −0.71 | −3.50 | −2.05 |

TABLE 1-continued

| | | DIS-PLAY PANEL 1 | DIS-PLAY PANEL 2 | DIS-PLAY PANEL 3 | DIS-PLAY PANEL 4 |
|---|---|---|---|---|---|
| (Vth) | BOTTOM LIGHT | −2.45 | −0.72 | −3.26 | −2.06 |
| | OBLIQUE LIGHT | −2.55 | −0.63 | −3.25 | −1.88 |
| LEAK-AGE CUR-RENT (Ioff) | ORIGINAL VALUE | 6.15E−13 | 4.40E−13 | 1.81E−12 | 7.28E−13 |
| | TOP LIGHT | 7.40E−13 | 5.38E−13 | 1.51E−12 | 6.71E−13 |
| | BOTTOM LIGHT | 1.83E−12 | 5.66E−13 | 3.51E−12 | 5.18E−13 |
| | OBLIQUE LIGHT | 2.71E−12 | 3.60E−12 | 6.06E−12 | 3.41E−12 |

*Changes of Lighting Characteristics of Light-Emitting Elements in Display Panels*

In some embodiments, a pixel can include a red sub-pixel, a green sub-pixel, and a blue sub-pixel. Table 2 shows the color coordinate values of the display panel before and after being irradiated. It is found that the color coordinate Y value changes greatly after being irradiated, and the decrease of Y value indicates that the luminescence of the green sub-pixel is weakened.

TABLE 2

| Color Coordinate Values Of Display Panel Before And After Being Irradiated | | |
|---|---|---|
| Color Coordinates (x, y) | Before being irradiated | (0.29995, 0.3123) |
| | After being irradiated | (0.3037, 0.2930) |
| | Difference value | (0.0042, 0.0193) |

As shown in FIG. 2, before being irradiated, the current drop of the display panel is 556.04/590.78=94.12%, and after being irradiated, the current drop of the display panel is 455.33/590.78=77.07%. Illumination makes the leakage current Ioff increase and the brightness decrease.

From the above analysis, it can be known that the leakage current Ioff of the pixel circuit changes after being irradiated, the green sub-pixel is sensitive, the increase of the leakage current Ioff leads to the increase of the leakage of the reset transistor and the threshold compensation transistor that are connected to the gate electrode of the driving transistor, which leads to a high voltage on the gate electrode of the driving transistor of the green sub-pixel; and as a result, it leads to the decrease of the luminous brightness of the green sub-pixel, and finally leads to the screen turning pink or red. At the same time, because of the increase of the leakage current Ioff, the voltage on the gate electrode of the driving transistor is unstable, which leads to the increase of flicker during low-frequency display.

In terms of turning pink, it is because the green sub-pixel is sensitive. The above process will also occur in the red sub-pixel and the blue sub-pixel. However, with the same current change, the red sub-pixel and the blue sub-pixel will not have much luminous difference because the light-emitting functional layer of the light-emitting element thereof is not so sensitive as the luminescent material emitting green light, while the green sub-pixel is sensitive and has a serious brightness attenuation, so the phenomenon of turning pink will occur.

Some embodiments of the present disclosure provide a display panel, in which the first electrode of the light-emitting element is used to shield the channels of the reset transistor and the threshold compensation transistor that are connected to the gate electrode of the driving transistor, so as to avoid the problems of turning pink, flickering and the like caused by the influence of strong light irradiating the channels on the characteristics of the transistors.

As shown in FIG. 3, the display panel includes a gate line GT1, a scan line GT2, a data line DT, a first power line PL1, a second power line PL2, a light-emitting control signal line EML, an initialization line INT, a reset control signal line RST, and the like. For example, the reset control signal line RST includes a reset control signal line RST1 and a reset control signal line RST2. The first power line PL1 is configured to provide a constant first voltage signal VDD to the sub-pixel 100, the second power line PL2 is configured to provide a constant second voltage signal VSS to the sub-pixel 100, and the first voltage signal VDD is greater than the second voltage signal VSS. The gate line GT1 is configured to provide a scan signal SCAN1 to the sub-pixel 100, the scan line GT2 is configured to provide a scan signal SCAN2 to the sub-pixel 100, the data line DT is configured to provide a data signal (data voltage) DATA to the sub-pixel 100, the light-emitting control signal line EML is configured to provide a light-emitting control signal EM to the sub-pixel 100, the reset control signal line RST1 is configured to provide a reset control signal RESET1 to the sub-pixel 100, and the reset control signal line RST2 is configured to provide a reset control signal RESET2 (scan signal SCAN2) to the sub-pixel 100. The initialization line INT1 is config-ured to provide a first initialization signal Vinit1 to the sub-pixel 100. The initialization line INT2 is configured to provide a second initialization signal Vinit2 to the sub-pixel 100. For example, the first initialization signal Vinit1 and the second initialization signal Vinit2 are constant voltage sig-nals, the magnitudes of which can be between the first voltage signal VDD and the second voltage signal VSS, but are not limited thereto. For example, both the first initial-ization signal Vinit1 and the second initialization signal Vinit2 can be less than or equal to the second voltage signal VSS. For example, the initialization line INT1 and the initialization line INT2 are insulated from each other to provide different initialization signals.

As shown in FIG. 3, the driving transistor T3 is electri-cally connected to the light-emitting element 100b, and outputs a driving current to drive the light-emitting element 100b to emit light under the control of signals such as the scan signal SCAN1, the scan signal SCAN2, the data signal DATA, the first voltage signal VDD, and the second voltage signal VSS, etc.

For example, the light-emitting element 100b includes an organic light-emitting diode (OLED), and the light-emitting element 100b is driven by the corresponding pixel circuit 100a to emit red light, green light, blue light, or white light, etc.

For example, as shown in FIG. 3, the gate electrode T4g of the data writing transistor T4 is connected to the scan line GT2, the first electrode T4a of the data writing transistor T4 is connected to the data line DT, and the second electrode T4b of the data writing transistor T4 is connected to the second electrode T3b of the driving transistor T3.

For example, as shown in FIG. 3, the pixel circuit 100a further includes a threshold compensation transistor T2, the gate electrode T2g of the threshold compensation transistor T2 is connected to the gate line GT1, the first electrode T2a of the threshold compensation transistor T2 is connected to the first electrode T3a of the driving transistor T3, and the second electrode T2b of the threshold compensation transistor T2 is connected to the gate electrode T3g of the driving transistor T3.

For example, as shown in FIG. 3, the display panel further includes a light-emitting control signal line EML, the pixel circuit 100a further includes a light-emitting control transistor T5 and a light-emitting control transistor T6, the gate electrode T5g of the light-emitting control transistor T5 is connected to the light-emitting control signal line EML, the first electrode T5a of the light-emitting control transistor T5 is connected to the first power line PL1, and the second electrode T5b of the light-emitting control transistor T5 is connected to the second electrode T3b of the driving transistor T3; the gate electrode T6g of the light-emitting control transistor T6 is connected to the light-emitting control signal line EML, the first electrode Toa of the light-emitting control transistor T6 is connected to the first electrode T3a of the driving transistor T3, and the second electrode Tob of the light-emitting control transistor T6 is connected to the first electrode E1 of the light-emitting element 100b.

As shown in FIG. 3, the reset transistor T1 is connected to the gate electrode T3g of the driving transistor T3 and is configured to reset the gate electrode T3g of the driving transistor T3, and the reset transistor T7 is connected to the first electrode E1 of the light-emitting element 100b and is configured to reset the first electrode E1 of the light-emitting element 100b. The initialization line INT1 is connected to the gate electrode T3g of the driving transistor T3 through the reset transistor T1. The initialization line INT2 is connected to the first electrode E1 of the light-emitting element 100b through the reset transistor T7.

For example, as shown in FIG. 3, the first electrode T1a of the reset transistor T1 is connected to the initialization line INT1, the second electrode T1b of the reset transistor T1 is connected to the gate electrode T3g of the driving transistor T3, and the gate electrode T1g of the reset transistor T1 is connected to the reset control signal line RST1.

For example, as shown in FIG. 3, the first electrode T7a of the reset transistor T7 is connected to the initialization line INT2, the second electrode T7b of the reset transistor T7 is connected to the first electrode E1 of the light-emitting element 100b, and the gate electrode T7g of the reset transistor T7 is connected to the reset control signal line RST2.

As shown in FIG. 3, the first power line PL1 is configured to provide a first voltage signal VDD to the pixel circuit 100a; the pixel circuit further includes a storage capacitor Cst, the first electrode plate Ca of the storage capacitor Cst is connected to the gate electrode T3g of the driving transistor T3, and the second electrode plate Cb of the storage capacitor Cst is connected to the first power line PL1 and the first electrode T5a of the light-emitting control transistor T5, respectively.

For example, as shown in FIG. 3, the display panel further includes a second power line PL2, and the second power line PL2 is connected to the second electrode E2 of the light-emitting element 100b.

As shown in FIG. 3, the gate line GT1 is connected to the gate electrode T2g of the threshold compensation transistor T2. The scan line GT2 is connected to the gate electrode T4g of the data writing transistor T4. For example, in one sub-pixel, the gate line GT1 is configured to provide a $n^{th}$-row scan signal SCAN1($n$), and the scan line GT2 is configured to provide a $n^{th}$-row scan signal SCAN2($n$).

In some embodiments of the present disclosure, as shown in FIG. 3, the first electrode plate Ca of the storage capacitor Cst is connected to the gate electrode T3g of the driving transistor T3, and the first electrode plate Ca of the storage capacitor Cst is connected to the reset transistor T1 and the threshold compensation transistor T2, respectively. For example, as shown in FIG. 3, the first electrode plate Ca of the storage capacitor Cst is connected to the second electrode T1b of the reset transistor T1 and the second electrode T2b of the threshold compensation transistor T2, respectively.

Figure 19:
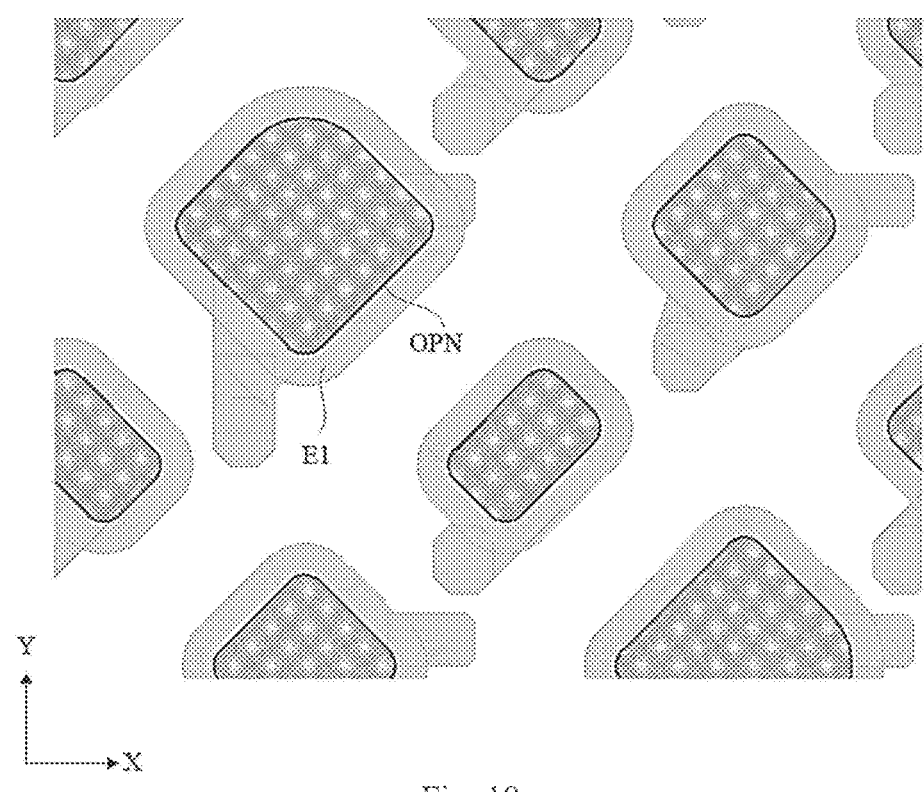
Figure 20:
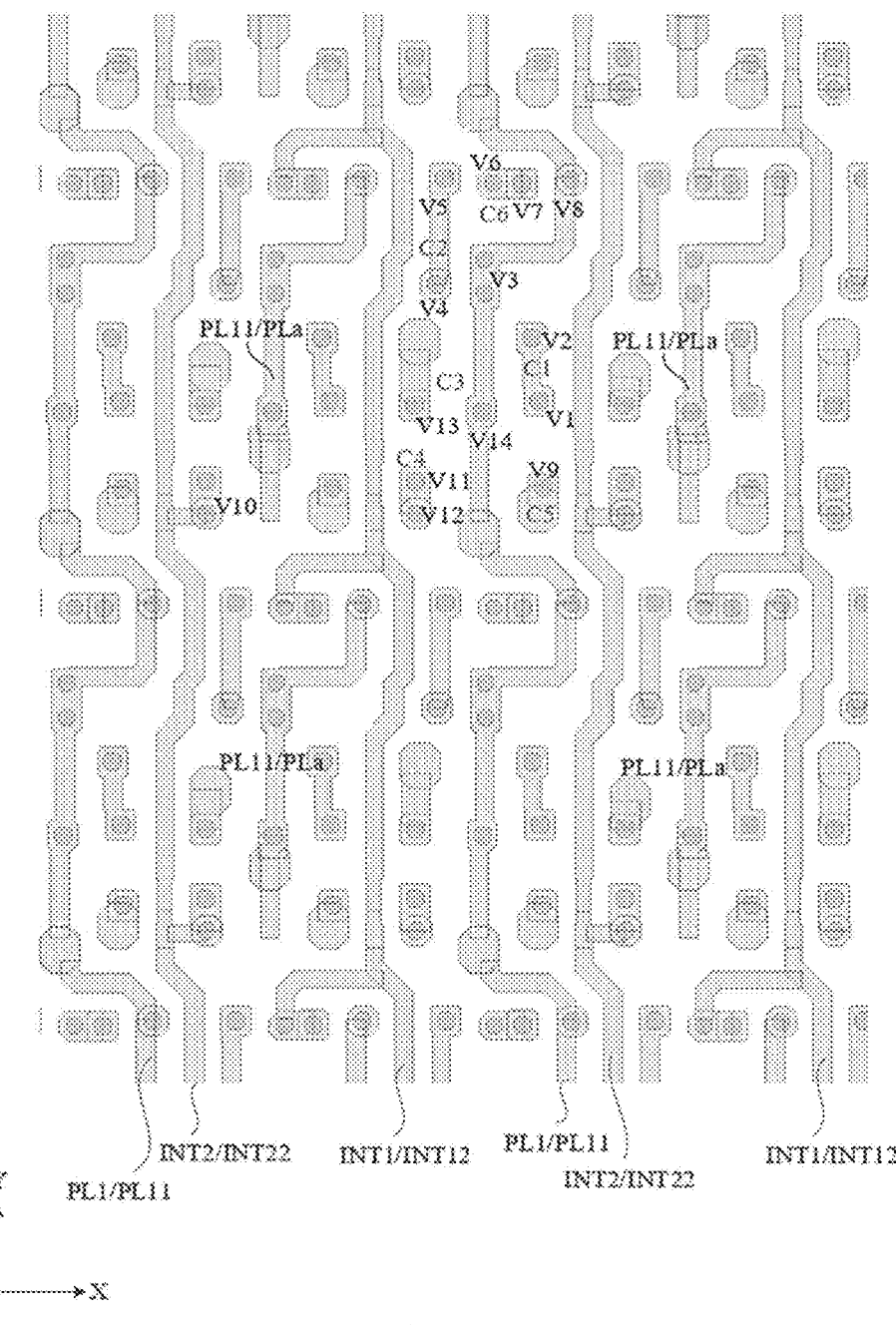
Figure 21A:
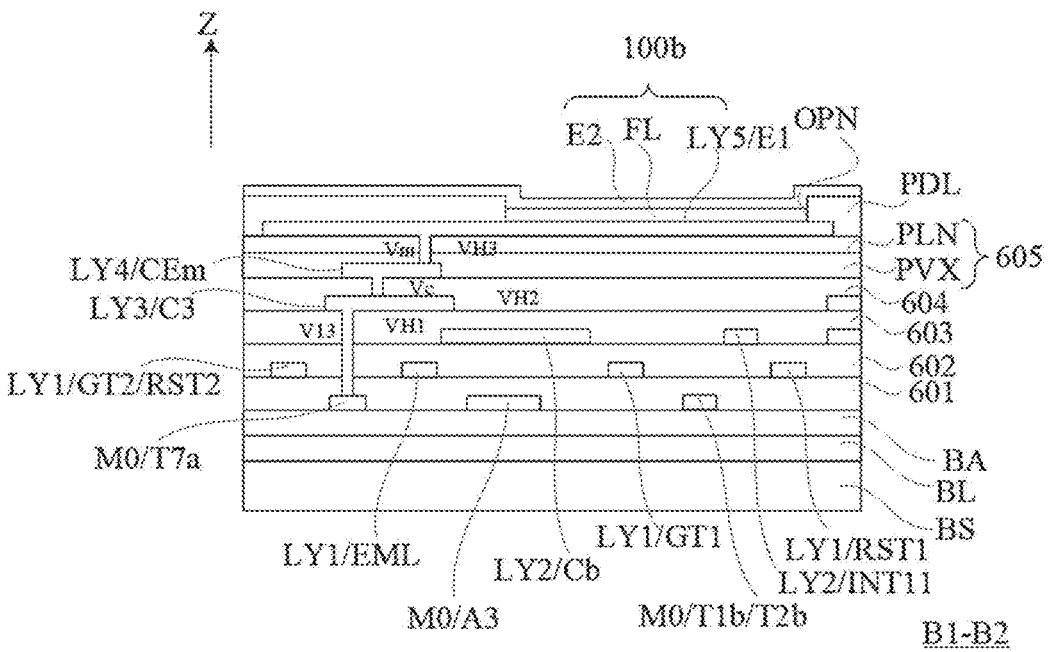
FIG. 21A is a cross-sectional view taken along line B1-B2 of FIG. 16.
Figure 21B:
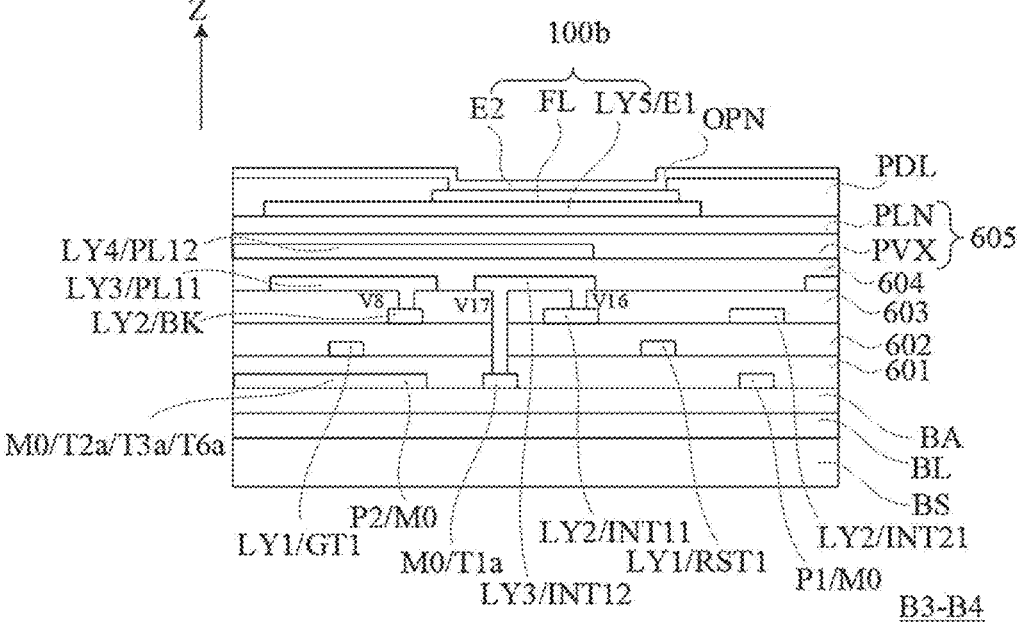
FIG. 21B is a cross-sectional view taken along line B3-B4 of FIG. 16.
Figure 22:
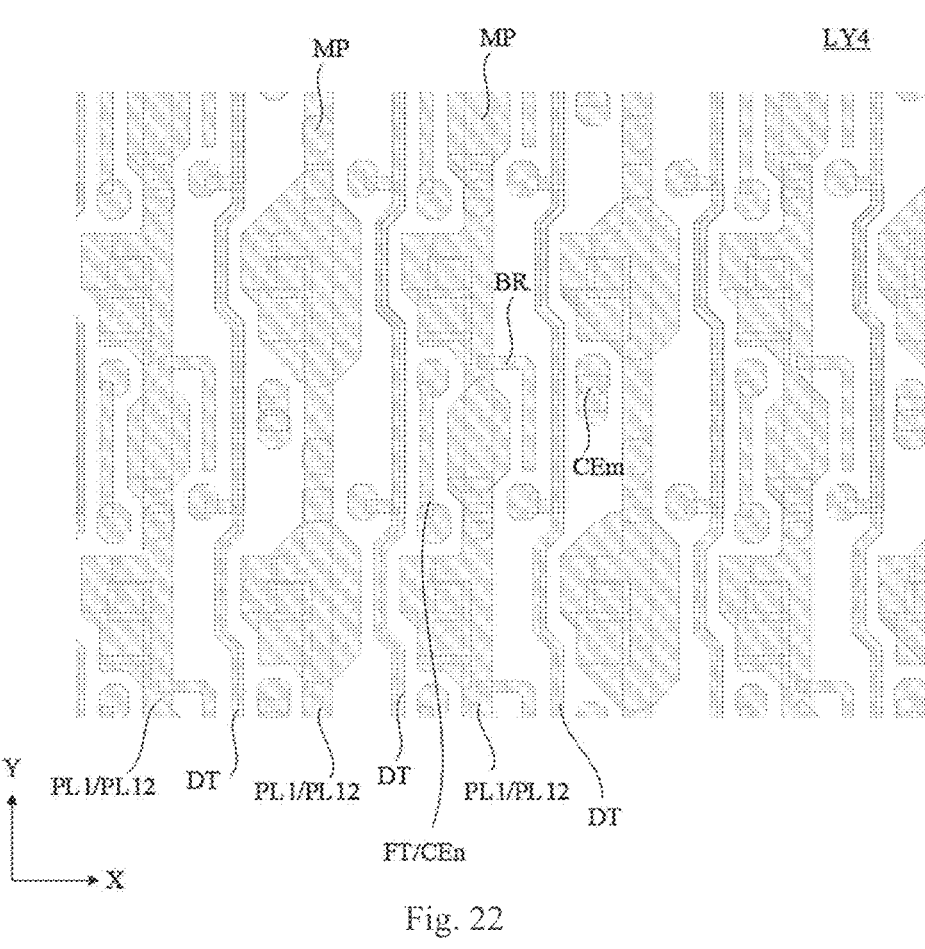
FIG. 22-FIG. 24 are plan views of single-layer structures in a display panel provided by some embodiments of the present disclosure.
Figure 23:
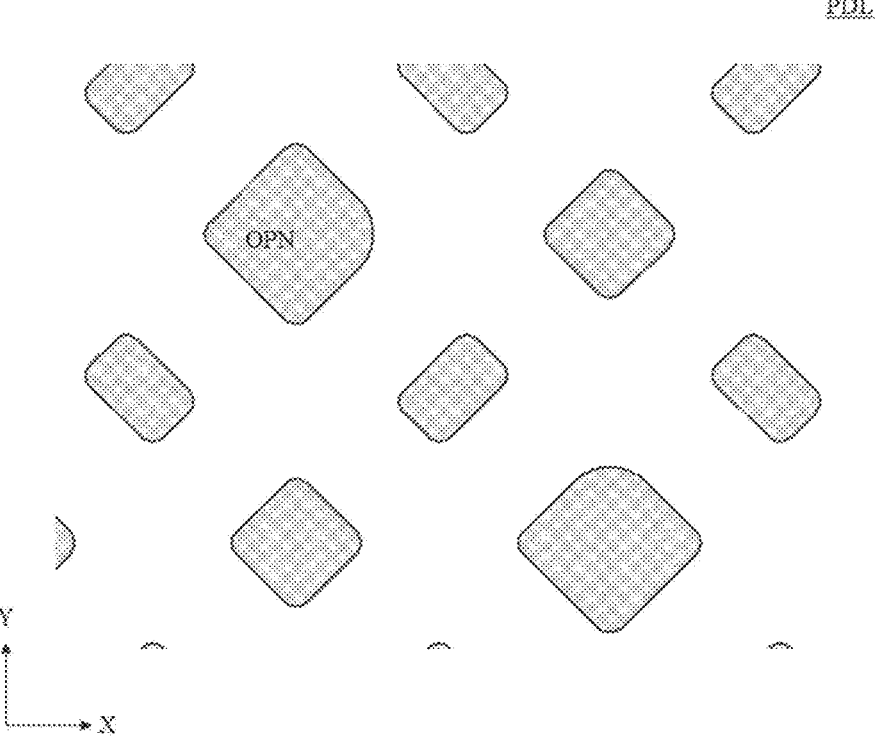
Figure 24:
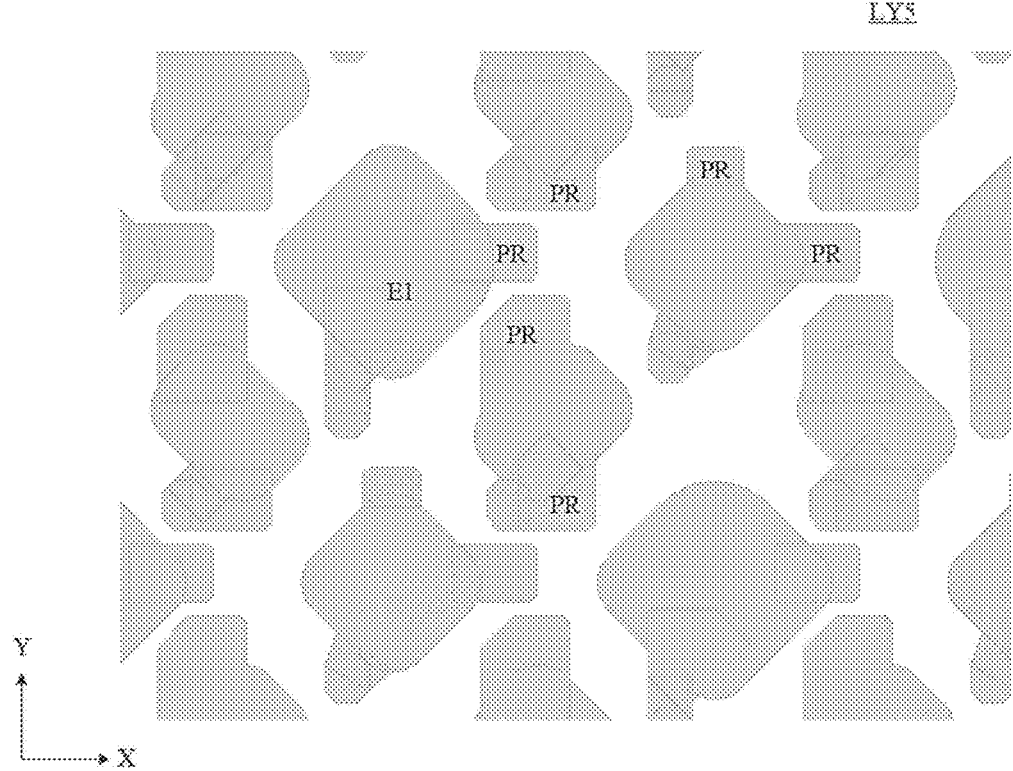

FIG. 4-FIG. 10 are plan views of single-layer structures in a display panel provided by some embodiments of the present disclosure. FIG. 11-FIG. 20 are plan views of stacked structures in a display panel provided by some embodiments of the present disclosure. FIG. 21A is a cross-sectional view taken along line B1-B2 of FIG. 16. FIG. 21B is a cross-sectional view taken along line B3-B4 of FIG. 16. FIG. 22-FIG. 24 are plan views of single-layer structures in a display panel provided by some embodiments of the present disclosure. FIG. 25A-FIG. 30 are plan views of stacked structures in a display panel provided by some embodiments of the present disclosure. FIG. 31-FIG. 34 are plan views of stacked structures in a display panel provided by some embodiments of the present disclosure.

In the embodiment of the present disclosure, the reference symbol on the upper right corner of a plan view indicates a single layer included in the plan view.

Figure 4:
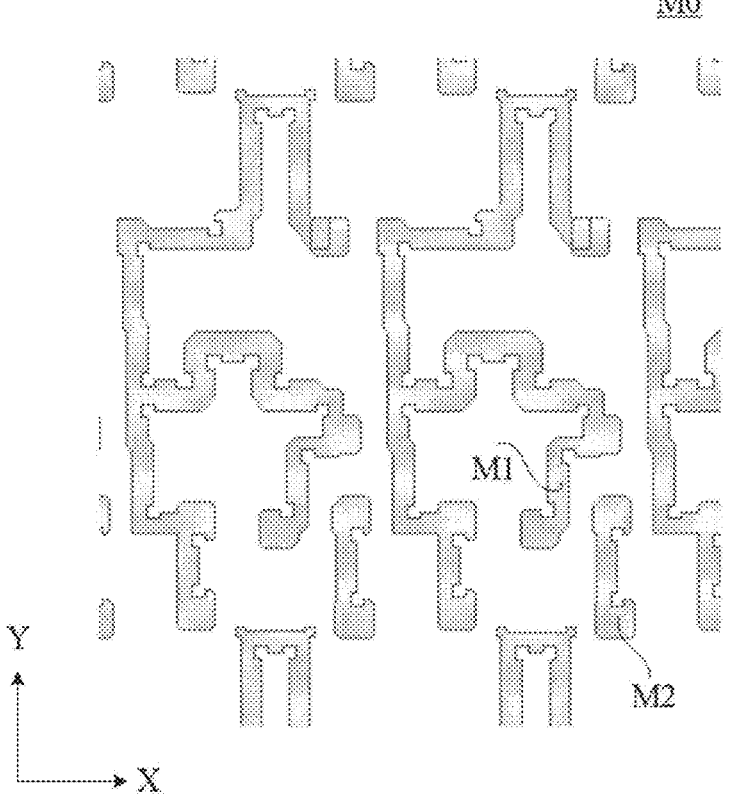
FIG. 4-FIG. 10 are plan views of single-layer structures in a display panel provided by some embodiments of the present disclosure.

FIG. 4 is a plan view of an active pattern layer M0 in a display panel provided by an embodiment of the present disclosure. The embodiment of the present disclosure is illustrated by taking that the active pattern layer M0 includes poly-silicon as an example.

Figure 5:
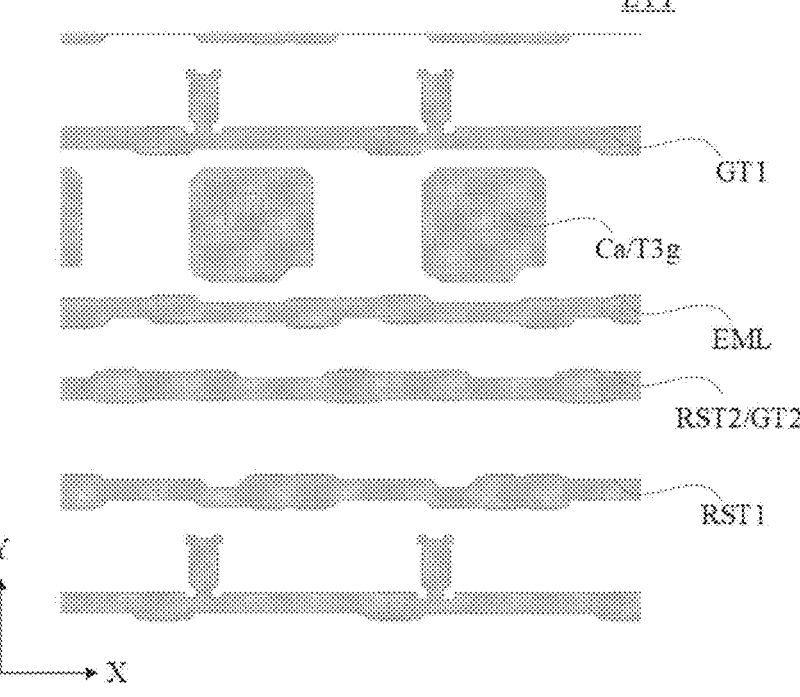

FIG. 5 is a plan view of a conductive pattern layer LY1 in a display panel provided by an embodiment of the present disclosure. As shown in FIG. 5, the conductive pattern layer LY1 includes the gate line GT1, the light-emitting control signal line EML, the reset control signal line RST2/scan line GT2, and the reset control signal line RST1.

As shown in FIG. 5, the reset control signal line RST2 and the scan line GT2 are of an integral structure. That is, the reset control signal line RST2 and the scan line GT2 are the same signal line.

As shown in FIG. 5, the gate line GT1 extends along the direction X, the light-emitting control signal line EML extends along the direction X, the reset control signal line RST2/scan line GT2 extends along the direction X, and the reset control signal line RST1 extends along the direction X.

As shown in FIG. 5, the gate line GT1, the light-emitting control signal line EML, the reset control signal line RST2/scan line GT2, and the reset control signal line RST1 are sequentially arranged along the direction Y.

FIG. 5 shows the gate electrode T3g of the driving transistor T3, and the gate electrode T3g of the driving transistor T3 also serves as the first electrode plate Ca of the storage capacitor Cst. That is, the gate electrode T3g of the driving transistor T3 and the first electrode plate Ca of the storage capacitor Cst are of an integral structure.

Figure 6:
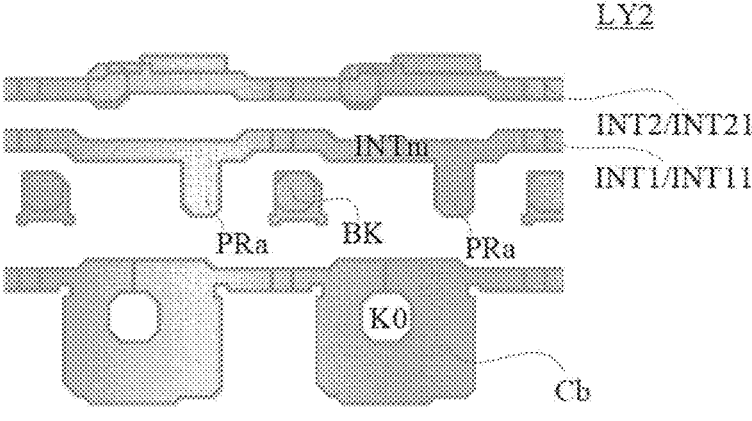
Figure 6:
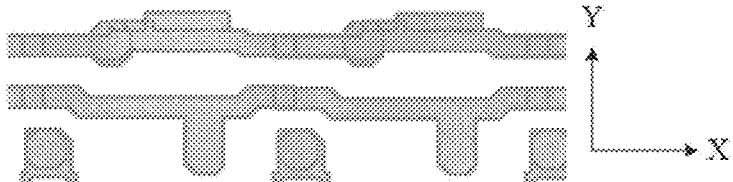

FIG. 6 is a plan view of a conductive pattern layer LY2 in a display panel provided by an embodiment of the present disclosure. As shown in FIG. 6, the conductive pattern layer LY2 includes a block BK, the first initialization signal line INT11, the second initialization signal line INT21, and the second electrode plate Cb of the storage capacitor Cst.

As shown in FIG. 6, the first initialization signal line INT11 extends along the direction X, and the second initialization signal line INT21 extends along the direction X.

As shown in FIG. 6, the first initialization signal line INT11 includes a main signal line INTm and protrusions PRa extending from the main signal line INTm, and the block BK is located within a space enclosed by the main signal line INTm, two adjacent protrusions PRa and the second electrode plate Cb of the storage capacitor Cst. As shown in FIG. 6, the main signal line INTm extends along the direction X, and the protrusions PRa intersect with the main signal line INTm. For example, the protrusions PRa are perpendicular to the main signal line INTm.

Figure 7:
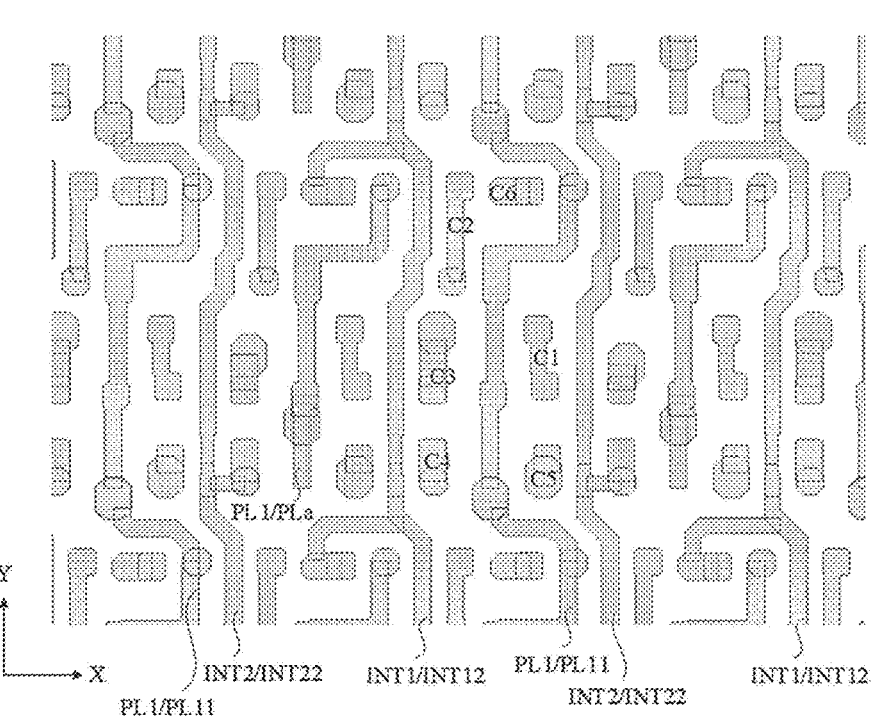

As shown in FIG. 6, the second electrode plate Cb has an opening K0 to facilitate the connection between a conductive connection component C1 (as shown in FIG. 7) and the first electrode plate Ca (the gate electrode T3g of the driving transistor T3).

As shown in FIG. 6, two adjacent second electrode plates Cb are of an integral structure.

FIG. 7 is a plan view of a conductive pattern layer LY3 in a display panel provided by an embodiment of the present disclosure. As shown in FIG. 7, the conductive pattern layer LY3 includes a first conductive line PL11, a first initialization connection line INT12, a second initialization connection line INT22, and conductive connection components C1-C6.

As shown in FIG. 7, the first conductive line PL11 extends along the direction Y, the first initialization connection line INT12 extends along the direction Y, and the second initialization connection line INT22 extends along the direction Y.

Figure 8:
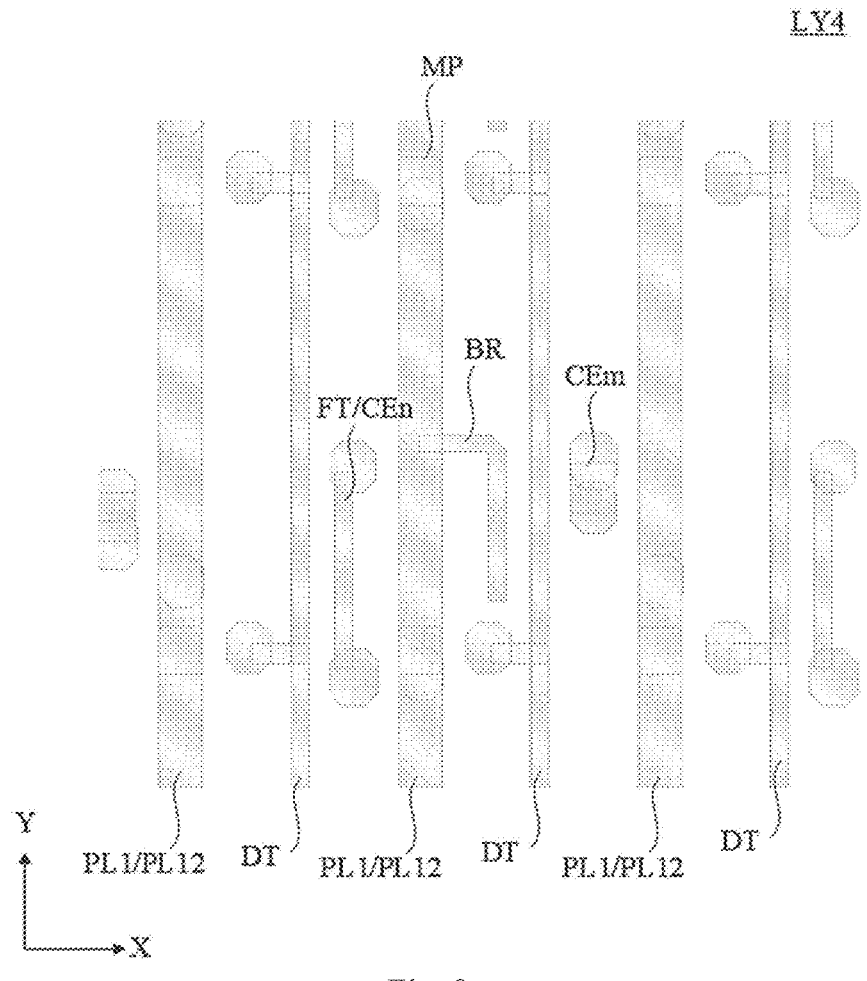

FIG. 8 is a plan view of a conductive pattern layer LY4 in a display panel provided by an embodiment of the present disclosure. As shown in FIG. 8, the conductive pattern layer LY4 includes the data line DT, a second conductive line PL12, a connection electrode CEm and a connection electrode CEn.

Figure 9:
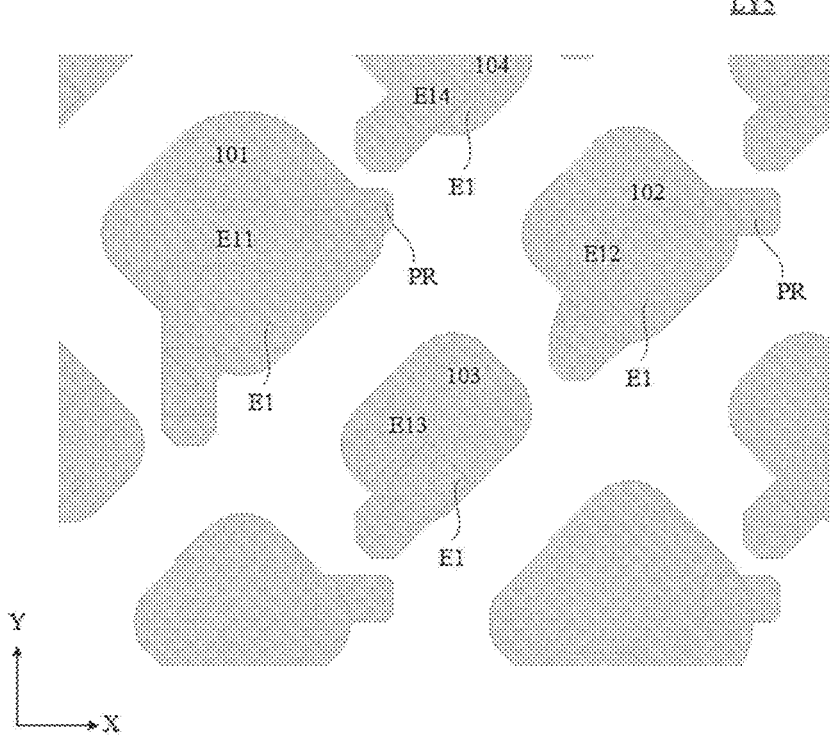

FIG. 9 is a plan view of an electrode pattern layer LY5 in a display panel provided by an embodiment of the present disclosure. As shown in FIG. 9, the electrode pattern layer LY5 includes a plurality of first electrodes E1. FIG. 9 shows a first electrode E11, a first electrode E12, a first electrode E13, and a first electrode E14.

Figure 10:
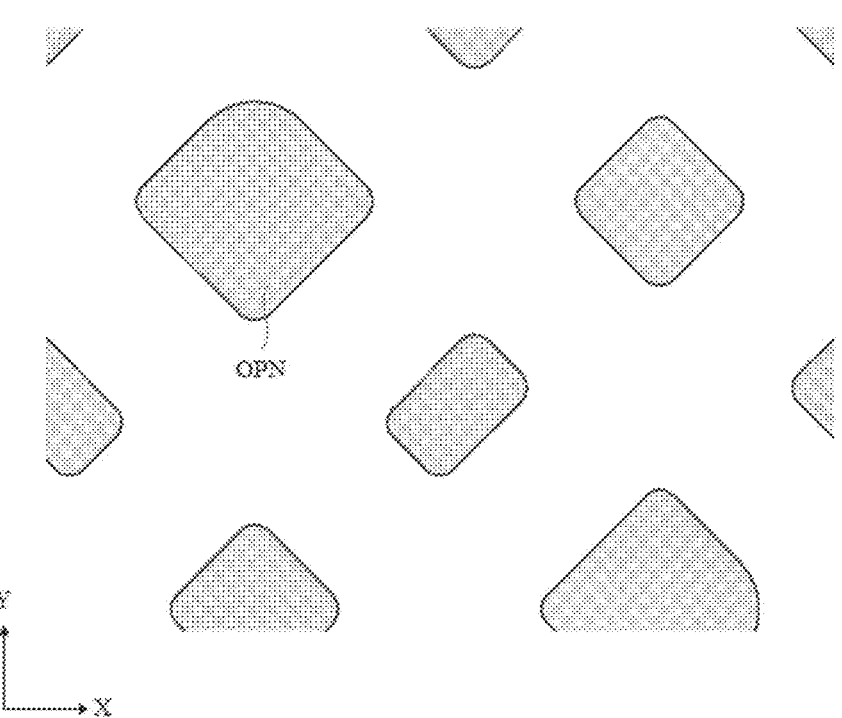

FIG. 10 is a plan view of a pixel defining layer PDL in a display panel provided by an embodiment of the present disclosure. As shown in FIG. 10, the pixel defining layer PDL includes an opening OPN. As shown in FIG. 10, the pixel defining layer PDL is shown with the opening OPN therein.

Figure 11:
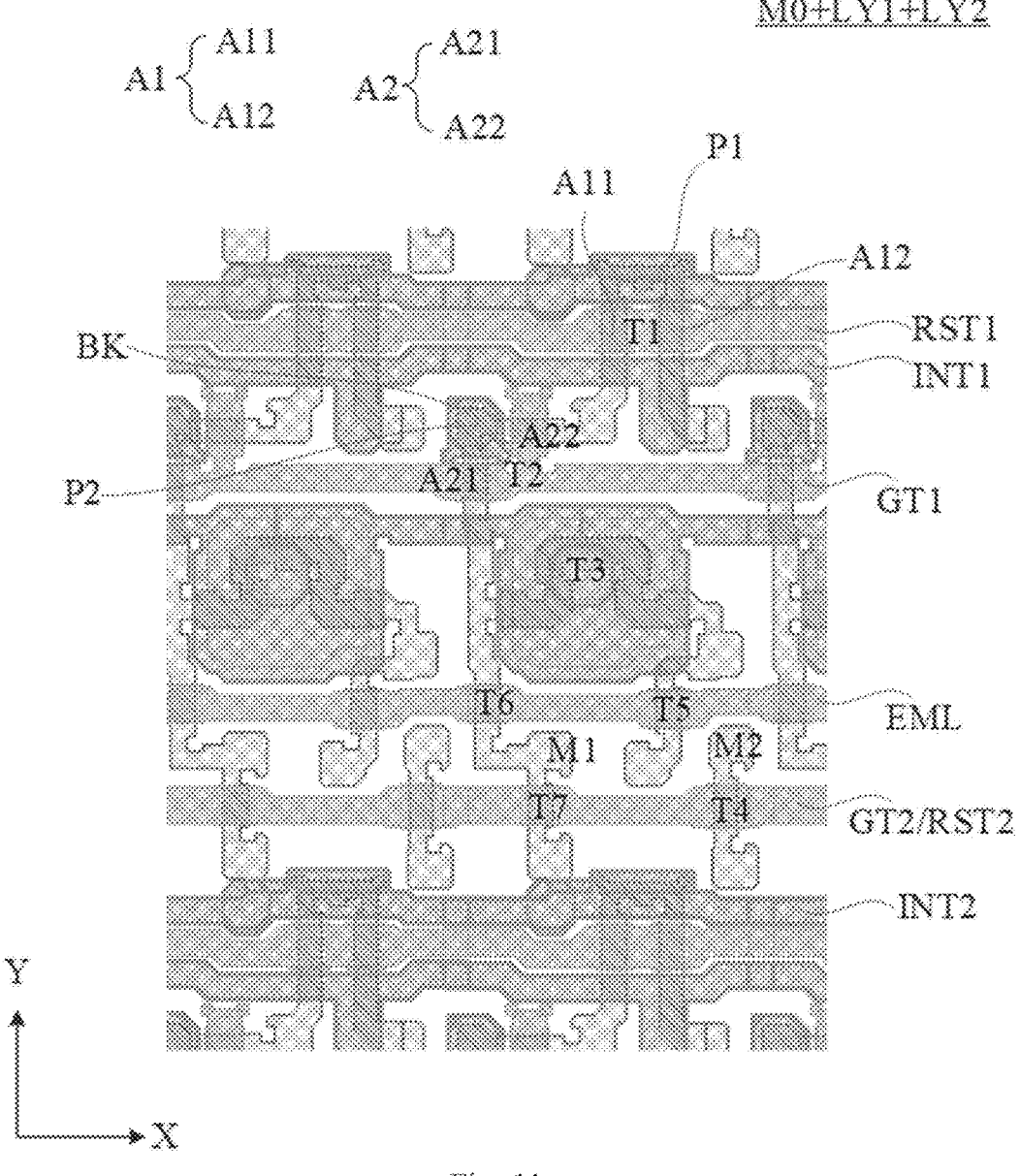
FIG. 11-FIG. 20 are plan views of stacked structures in a display panel provided by some embodiments of the present disclosure.
Figure 12:
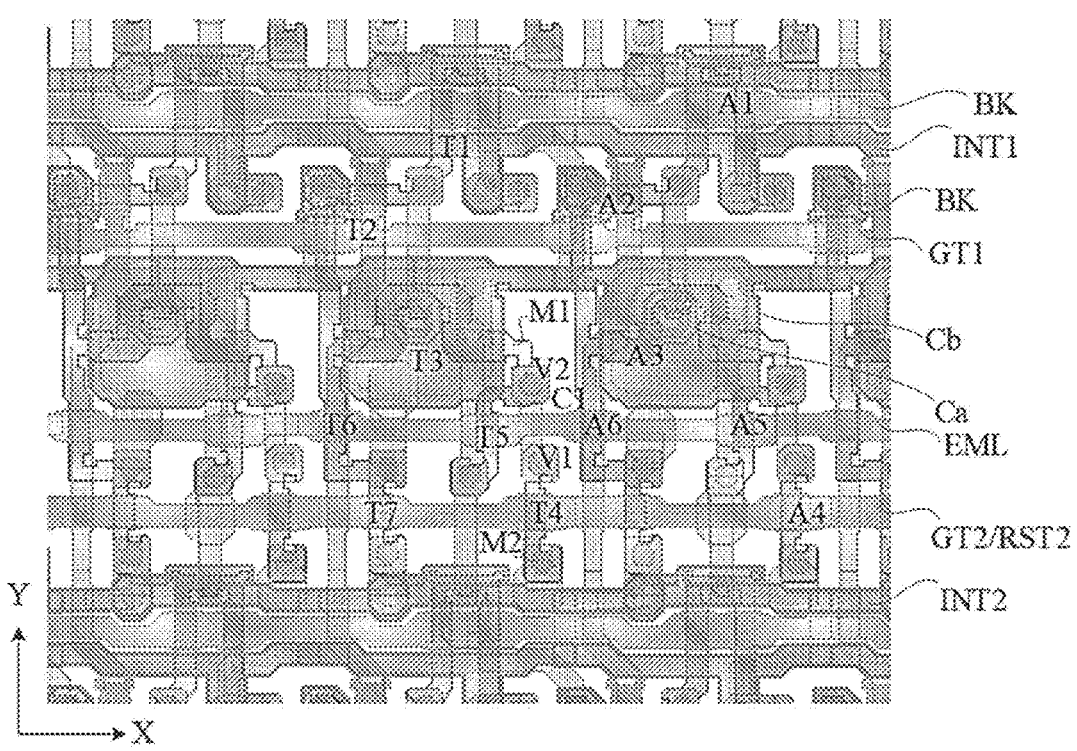
Figure 13:
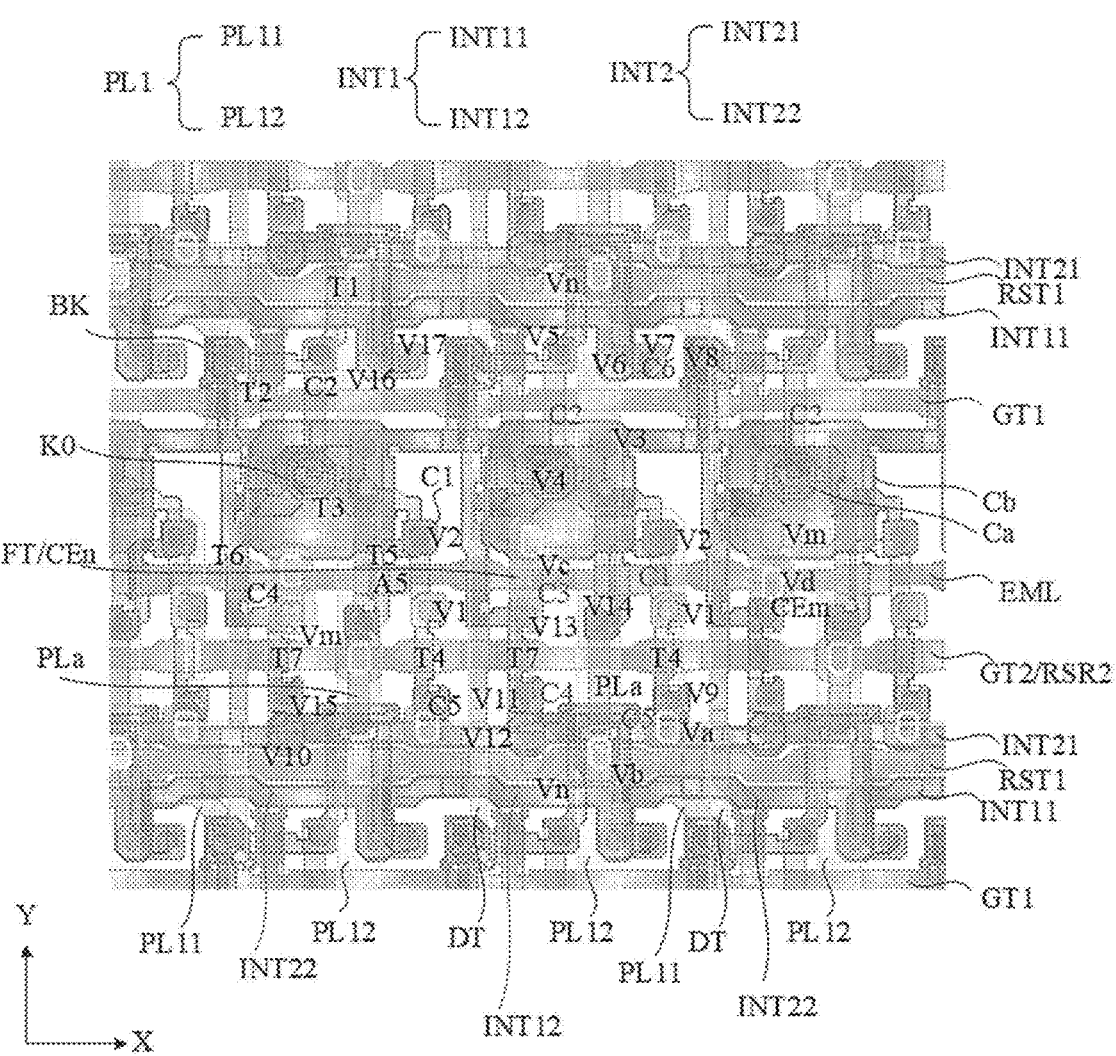
Figure 14:
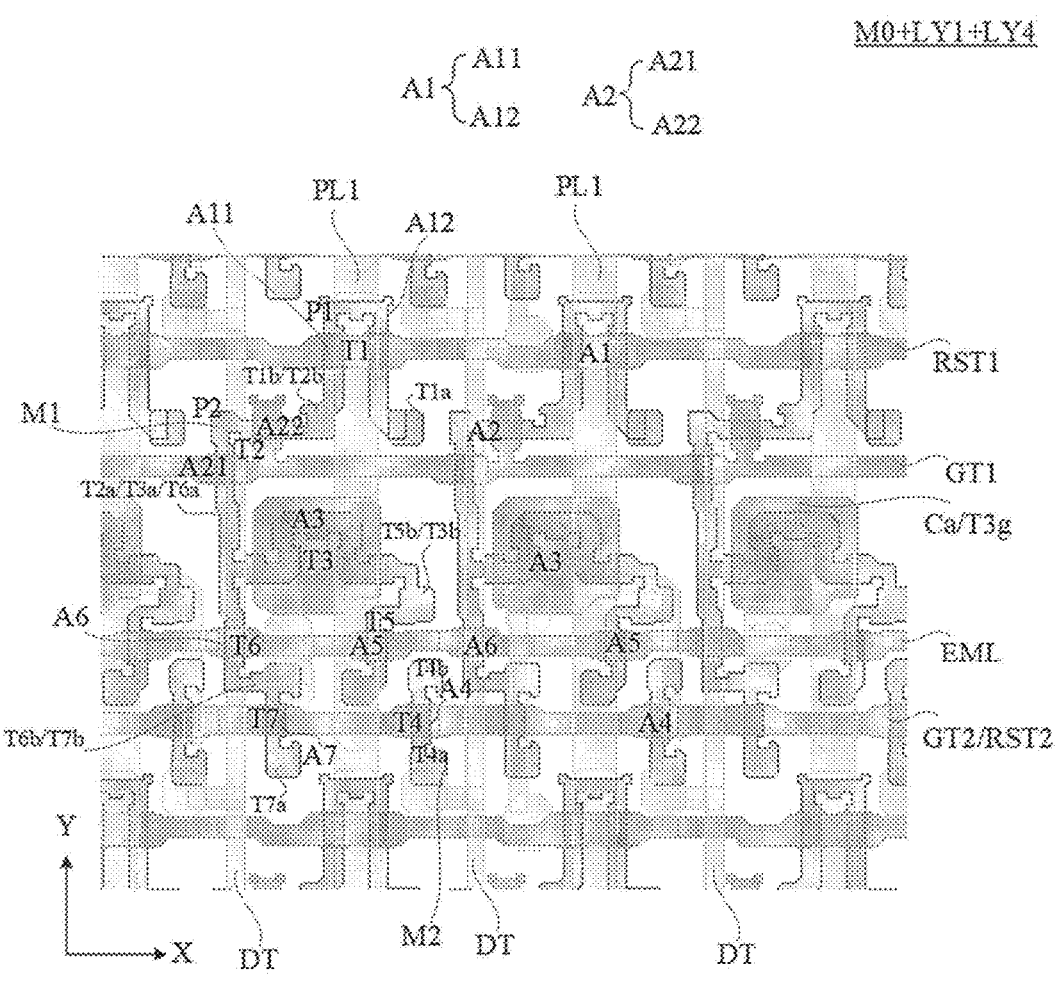
Figure 15:
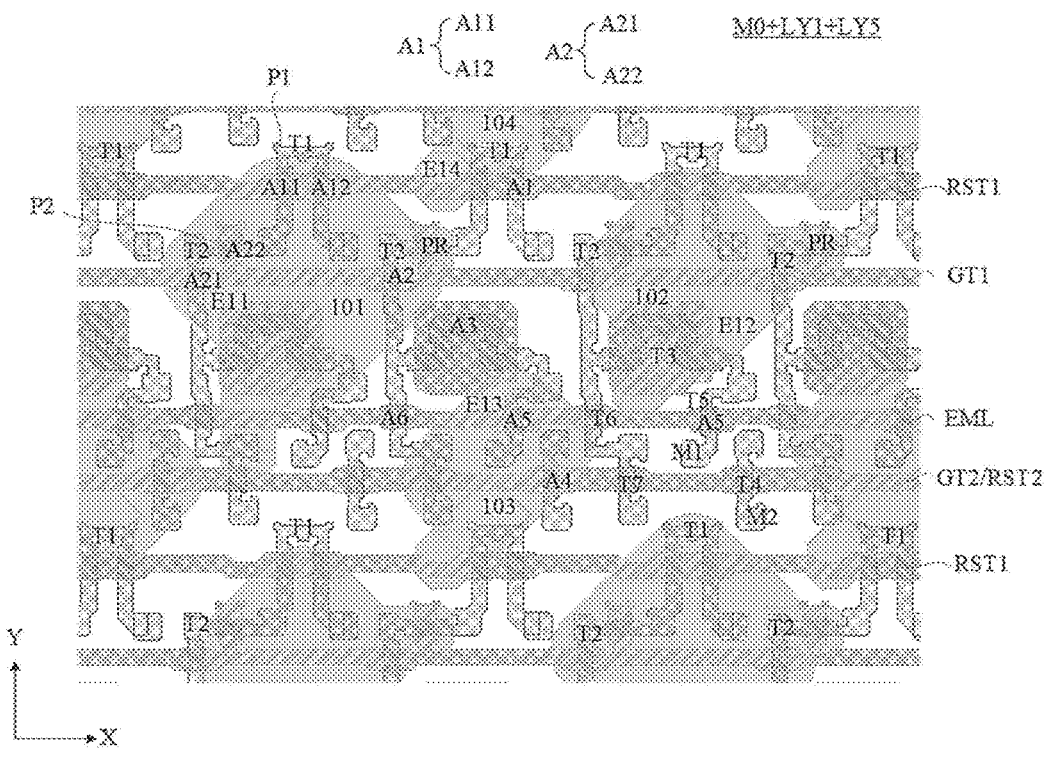
Figure 16:
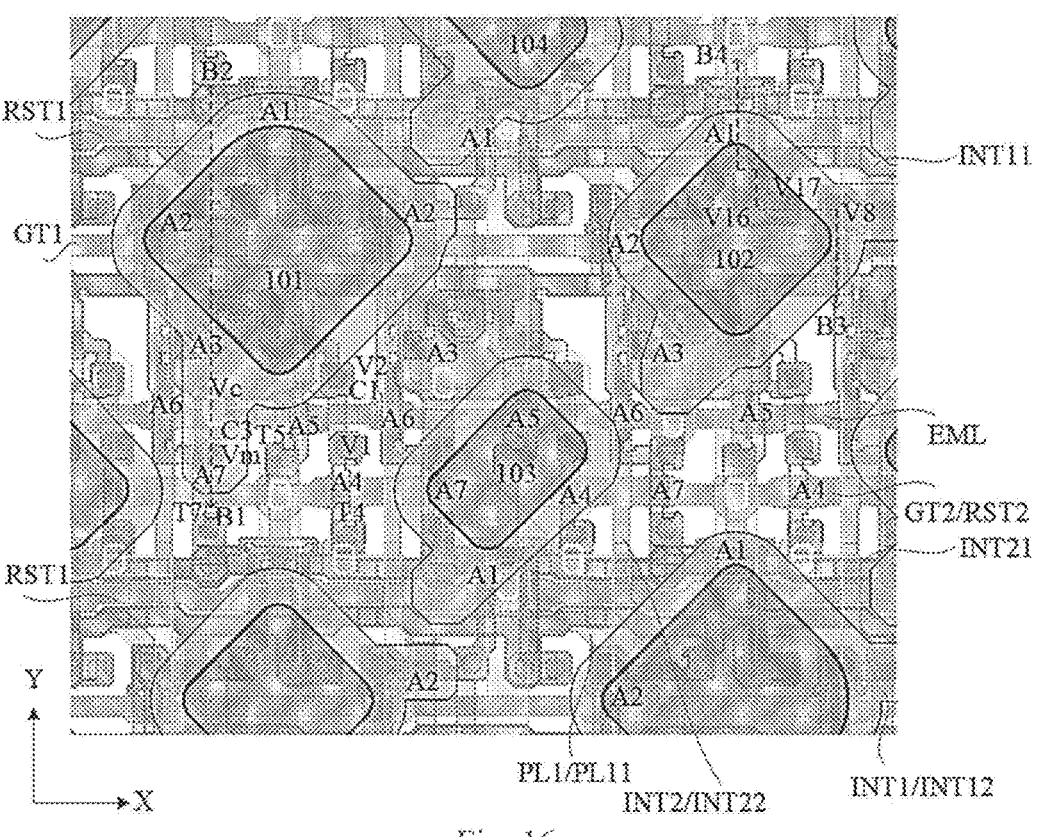
Figure 17:
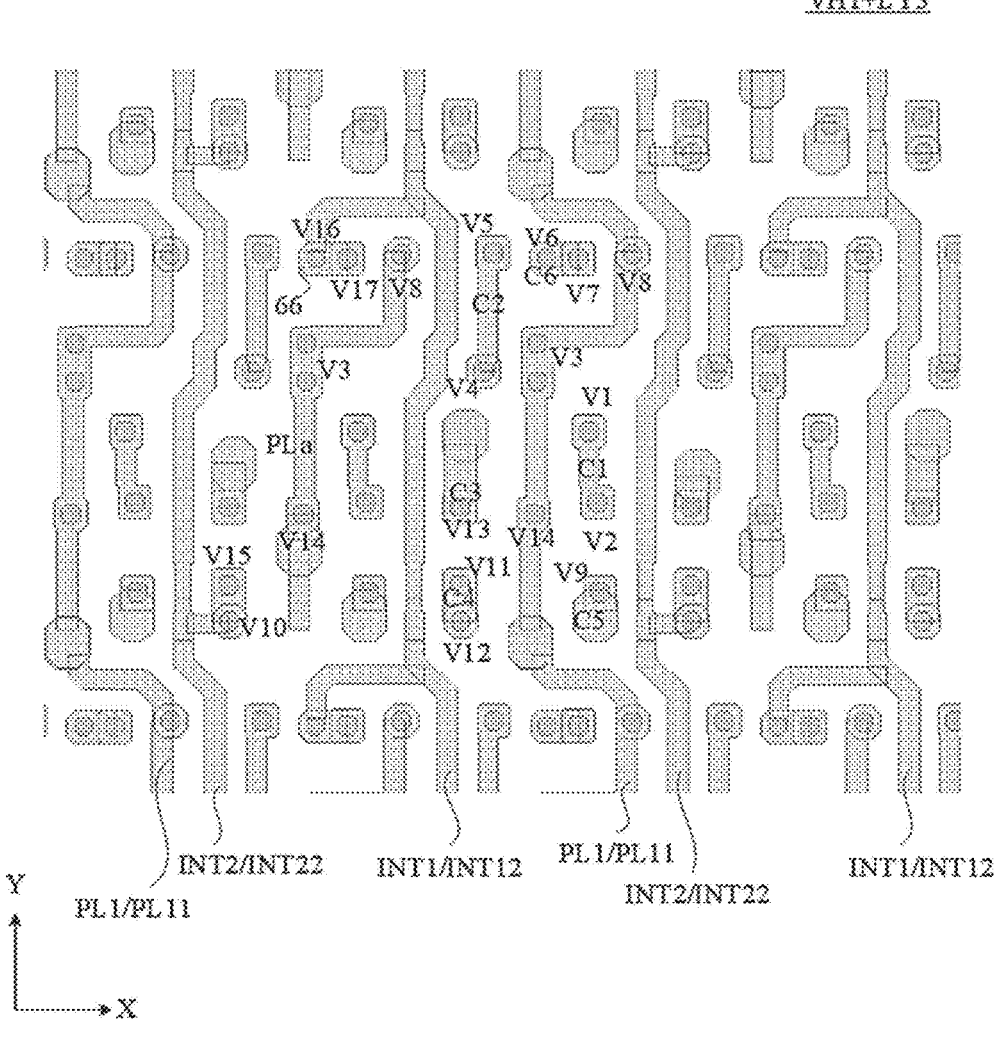
Figure 18A:
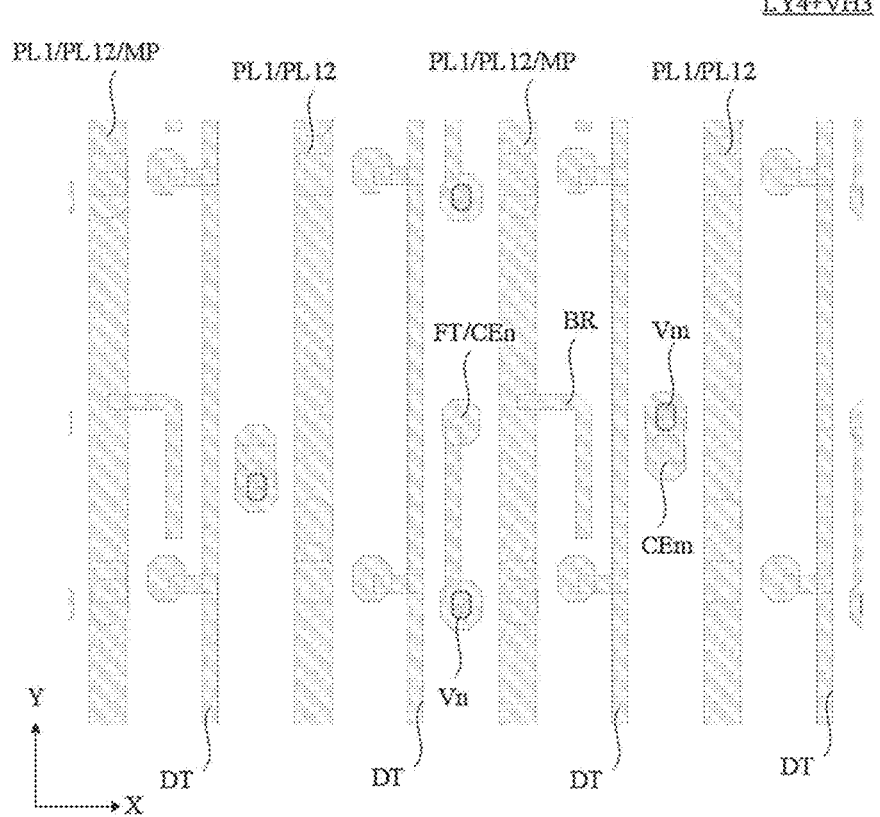
Figure 18B:
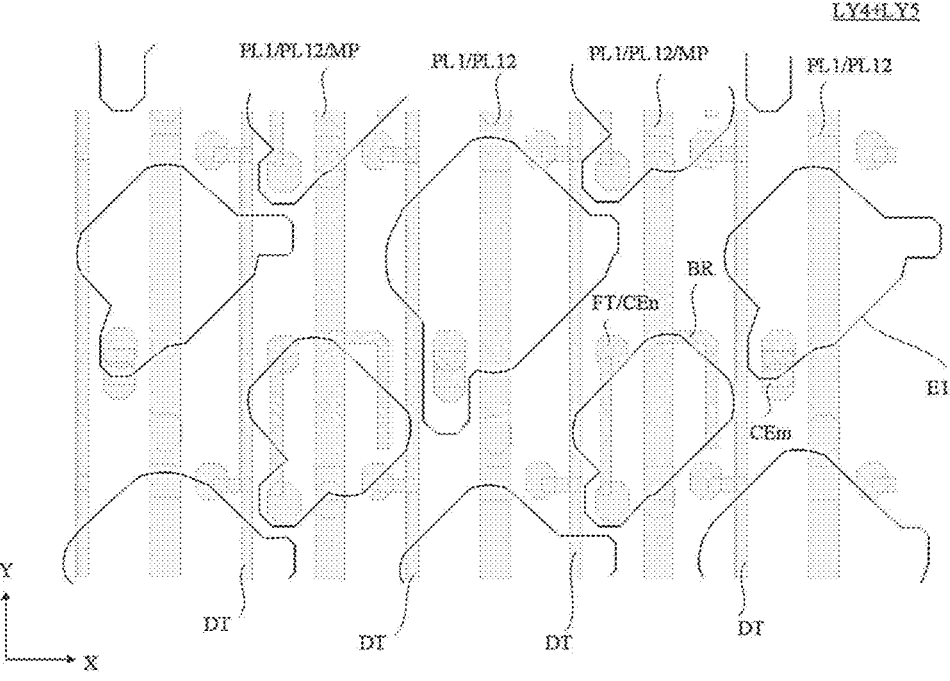

FIG. 11 is a schematic diagram of a stack of an active pattern layer M0, a conductive pattern layer LY1, and a conductive pattern layer LY2 in a display panel provided by an embodiment of the present disclosure. FIG. 12 is a schematic diagram of a stack of an active pattern layer M0, a conductive pattern layer LY1, a conductive pattern layer LY2, a via hole structure VH1, and a conductive pattern layer LY3 in a display panel provided by an embodiment of the present disclosure. FIG. 13 is a schematic diagram of a stack of an active pattern layer M0, a conductive pattern layer LY1, a conductive pattern layer LY2, a via hole structure VH1, a conductive pattern layer LY3, a via hole structure VH2, a conductive pattern layer LY4, and a via hole structure VH3 in a display panel provided by an embodiment of the present disclosure. FIG. 14 is a schematic diagram of a stack of an active pattern layer M0, a conductive pattern layer LY1, and a conductive pattern layer LY4 in a display panel provided by an embodiment of the present disclosure. FIG. 15 is a schematic diagram of a stack of an active pattern layer M0, a conductive pattern layer LY1, and an electrode pattern layer LY5 in a display panel according to an embodiment of the present disclosure. FIG. 16 is a schematic diagram of a stack of an active pattern layer M0, a conductive pattern layer LY1, a conductive pattern layer LY2, a via hole structure VH1, a conductive pattern layer LY3, a via hole structure VH2, a conductive pattern layer LY4, a via hole structure VH3, an electrode pattern layer LY5, and a pixel defining layer PDL in a display panel provided by an embodiment of the present disclosure. FIG. 17 is a schematic diagram of a stack of a via hole structure VH1 and a conductive pattern layer LY3 in a display panel provided by an embodiment of the present disclosure. FIG. 18A is a schematic diagram of a stack of a conductive pattern layer LY4 and a via hole structure VH3 in a display panel provided by an embodiment of the present disclosure. FIG. 18B is a schematic diagram of a stack of a conductive pattern layer LY4 and an electrode pattern layer LY5 in a display panel provided by an embodiment of the present disclosure. FIG. 19 is a schematic diagram of a stack of an electrode pattern layer LY5 and a pixel defining layer PDL in a display panel provided by an embodiment of the present disclosure. FIG. 20 is a schematic diagram of a stack of a via hole structure VH1 and a conductive pattern layer LY3 in a display panel provided by an embodiment of the present disclosure. FIG. 21A is a cross-sectional view taken along line B1-B2 of FIG. 16. FIG. 21B is a cross-sectional view taken along line B3-B4 of FIG. 16. For the sake of clarity, the light-emitting functional layer and the second electrode E2 are omitted in FIG. 16.

As shown in FIG. 21A, in the display panel, a buffer layer BL is disposed on a base substrate BS, a barrier layer BA is disposed on the buffer layer BL, an active pattern layer M0 is disposed on the barrier layer BA, an insulating layer 601 is disposed on the active pattern layer M0, a conductive pattern layer LY1 is disposed on the insulating layer 601, an insulating layer 602 is disposed on the conductive pattern layer LY1, a conductive pattern layer LY2 is disposed on the insulating layer 602, an insulating layer 603 is disposed on the conductive pattern layer LY2, a conductive pattern layer LY3 is disposed on the insulating layer 603, an insulating layer 604 is disposed on the conductive pattern layer LY3, a conductive pattern layer LY4 is disposed on the insulating layer 604, an insulating layer 605 is disposed on the insulating layer 605, an electrode pattern layer LY5 is disposed on the electrode pattern layer LY5, a pixel defining layer PDL is disposed on the electrode pattern layer LY5, a light-emitting functional layer FL is disposed in the opening OPN of the pixel defining layer PDL, and a second electrode E2 is disposed on the light-emitting functional layer FL.

It should be noted that in the embodiment of the present disclosure, the light-emitting functional layer FL of the light-emitting element can include an electroluminescent layer itself and common layers located at both sides of the electroluminescent layer. For example, the common layers can include at least one of a hole injection layer, a hole transport layer, an electron injection layer and an electron transport layer.

As shown in FIG. 21A, the via hole structure VH1 refers to a via hole through which a component in the conductive pattern layer LY3 is connected to a component in a film layer below the conductive pattern layer LY3. The film layer below the conductive pattern layer LY3 includes the active pattern layer M0, the conductive pattern layer LY1, and the conductive pattern layer LY2. As shown in FIG. 21A, the via hole structure VH1 refers to a via hole that penetrates at least one of the insulating layer 603, the insulating layer 602, and the insulating layer 601.

For example, in the embodiment of the present disclosure, as shown in FIG. 17, the via hole structure VH1 includes via holes V1-V17.

As shown in FIG. 21A, the via hole structure VH2 refers to a via hole through which a component in the conductive pattern layer LY4 is connected to a component in the conductive pattern layer LY3. As shown in FIG. 21A, the via hole structure VH2 refers to a via hole penetrating the insulating layer 604.

For example, in the embodiment of the present disclosure, the via hole structure VH2 includes a via hole Va, a via hole Vb, a via hole Vc and a via hole Vd.

As shown in FIG. 21A, the via hole structure VH3 refers to a via hole through which a component in the electrode pattern layer LY5 is connected to a component in the conductive pattern layer LY3. As shown in FIG. 21A, the via hole structure VH3 refers to a via hole penetrating the insulating layer 605.

As shown in FIG. 21A, the insulating layer 605 can include a passivation layer PVX and a planarization layer PLN, but is not limited thereto.

Figure 25A:
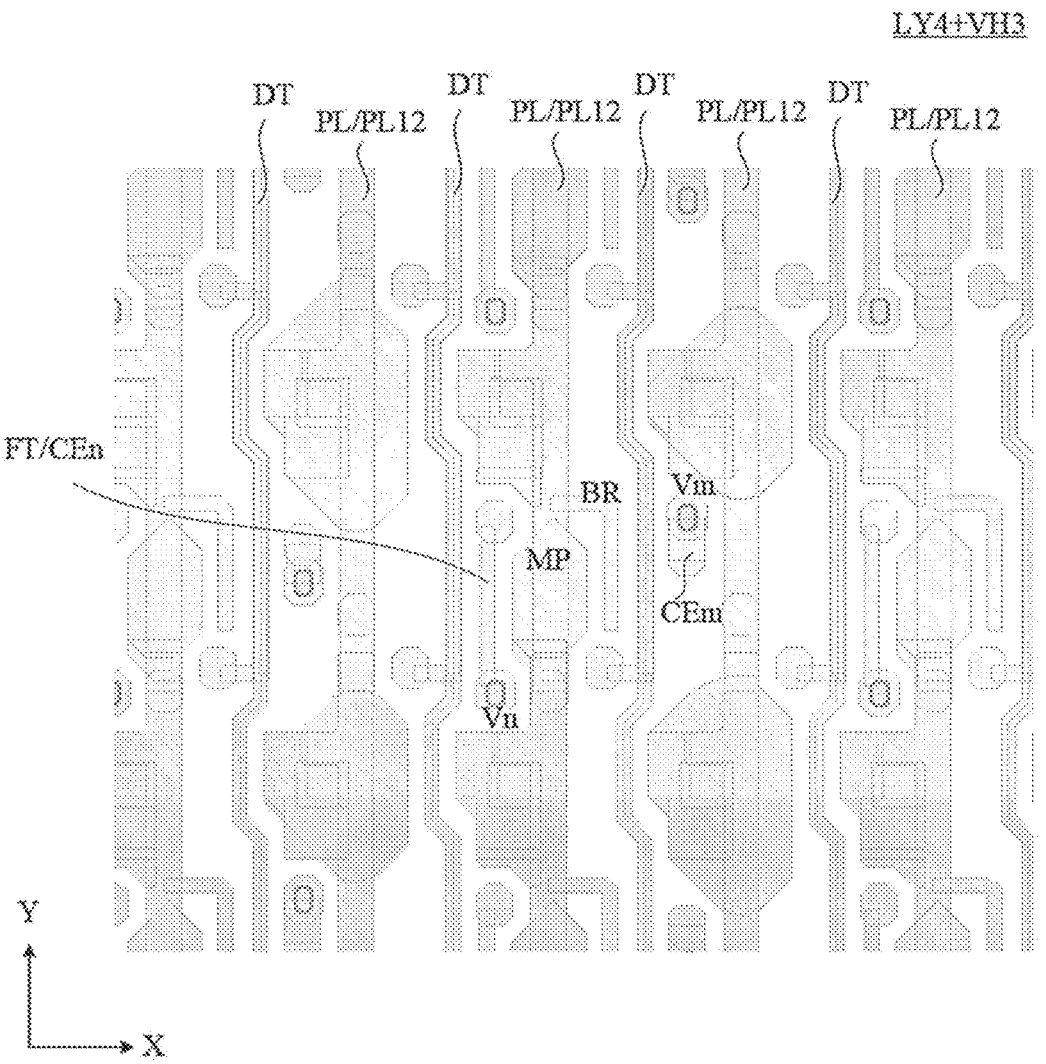
FIG. 25A-FIG. 30 are plan views of stacked structures in a display panel provided by some embodiments of the present disclosure.
Figure 25B:
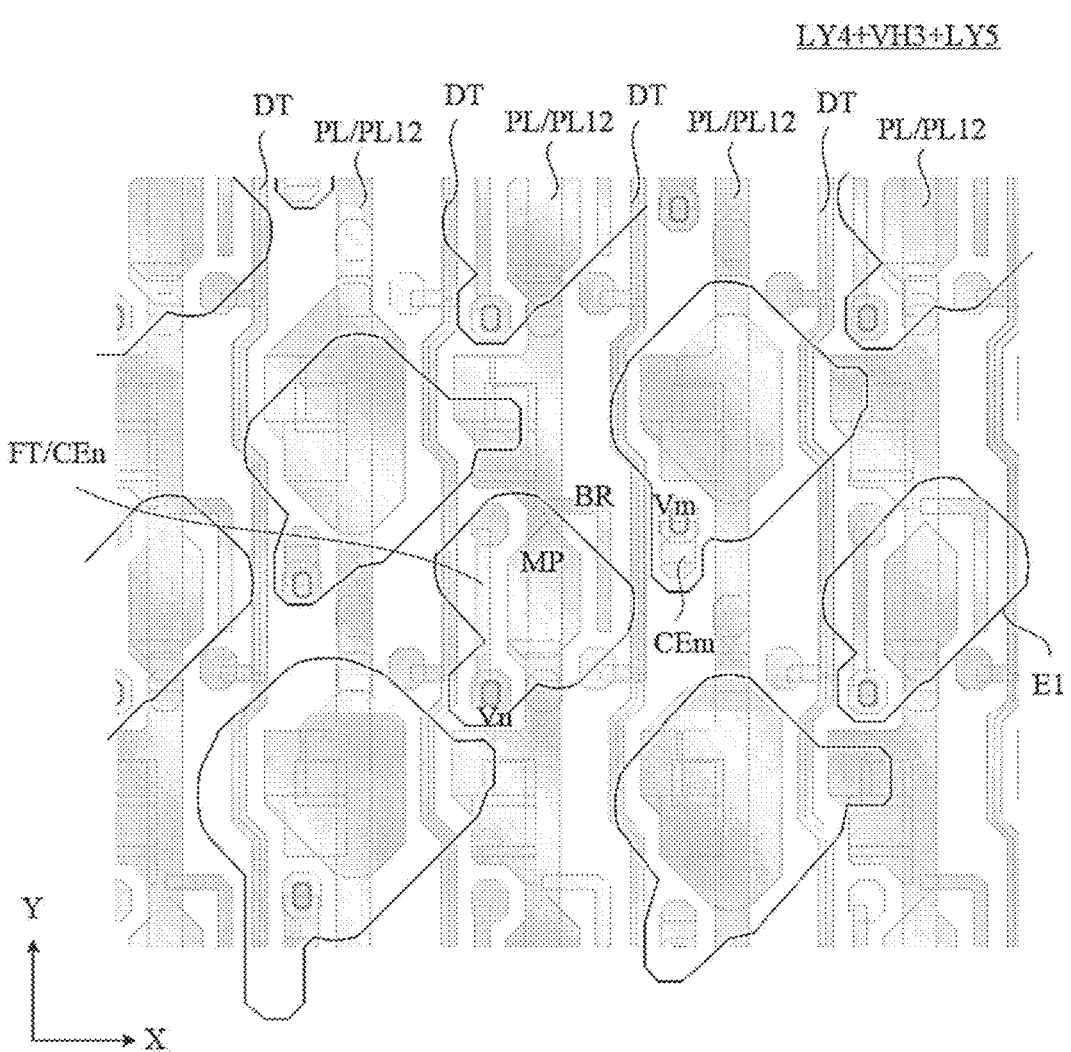

For example, in the embodiment of the present disclosure, as shown in FIG. 25A and FIG. 25B, the via hole structure VH3 includes a via hole Vn and a via hole Vm.

FIG. 21B shows a via hole V8, a via hole V16, and a via hole V17. As shown in FIG. 21B, the first conductive line PL11 and the block BK are connected through the via hole V8. As shown in FIG. 21B, the first initialization connection line INT12 and the first initialization signal line INT11 are connected through the via hole V16, and the first initialization connection line INT12 and the first electrode T1a of the reset transistor T1 are connected through the via hole V17.

FIG. 21B further shows a second conductive line PL12, a gate line GT1, and a reset control signal line RST1.

FIG. 21B further shows a conductive portion P1 and a conductive portion P2. The orthographic projection of the block BK on the base substrate BS overlaps with the orthographic projection of the conductive portion P2 on the base substrate BS, and the orthographic projection of the second initialization signal line INT21 on the base substrate BS overlaps with the orthographic projection of the conductive portion P1 on the base substrate BS.

As shown in FIG. 9 and FIG. 15, the sub-pixel 101 includes a first electrode E11, the sub-pixel 102 includes a first electrode E12, the sub-pixel 103 includes a first electrode E13, and the sub-pixel 104 includes a first electrode E14. The embodiment of the present disclosure is illustrated by taking the example that the sub-pixel 101 is a blue sub-pixel, the sub-pixel 102 is a red sub-pixel, the sub-pixel 103 is a green sub-pixel and the sub-pixel 104 is a green sub-pixel. Of course, the sub-pixels can also emit light of other colors, and the luminous conditions of the sub-pixels can be determined as needed.

Figure 26:
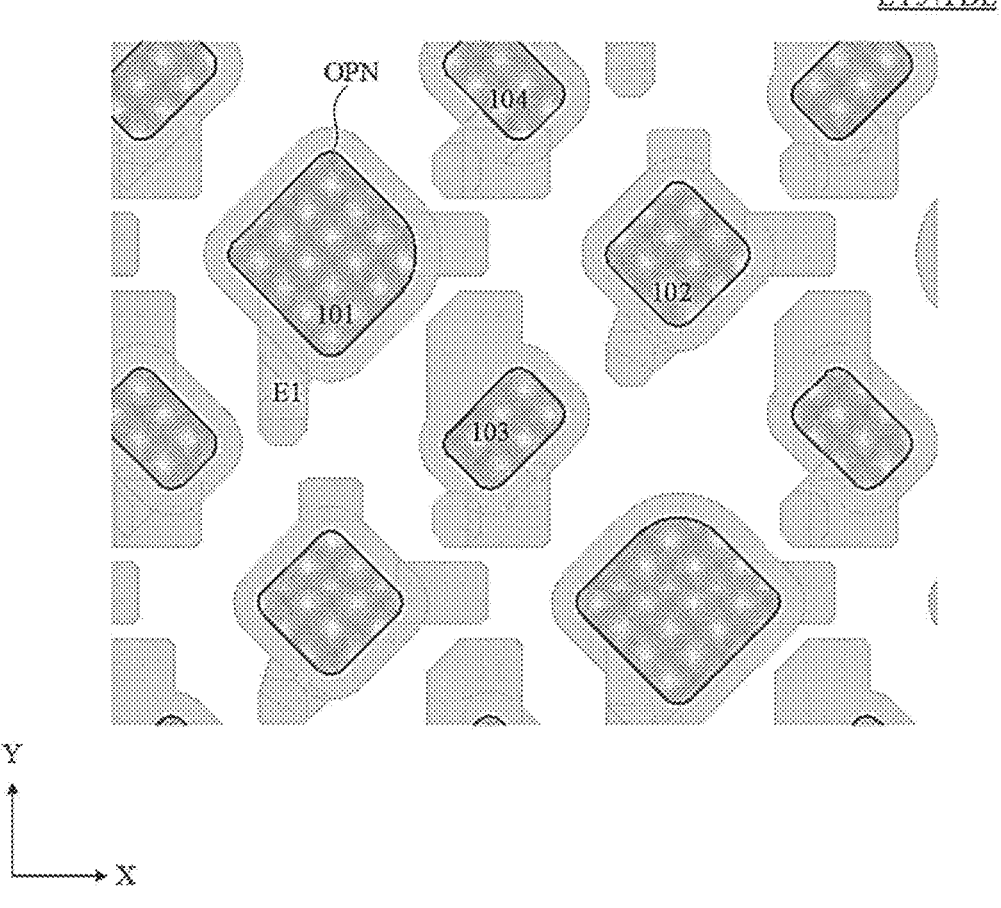
Figure 27:
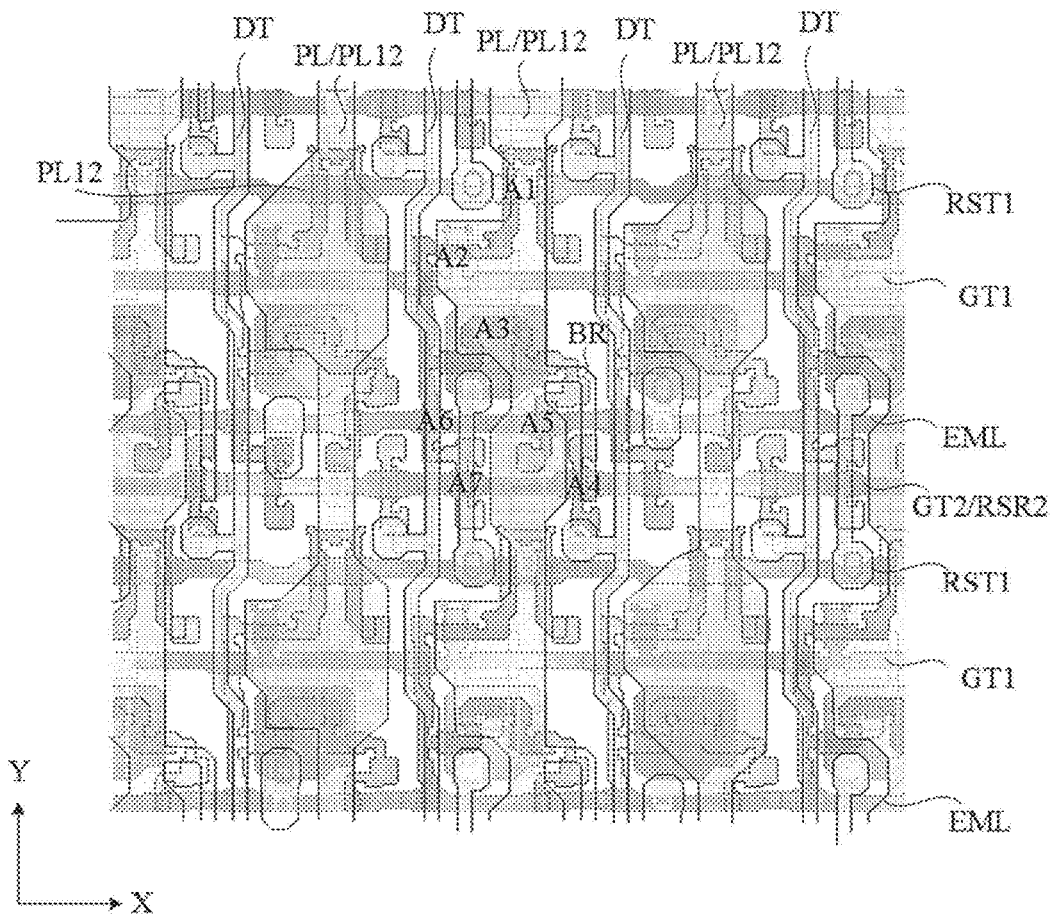
Figure 28:
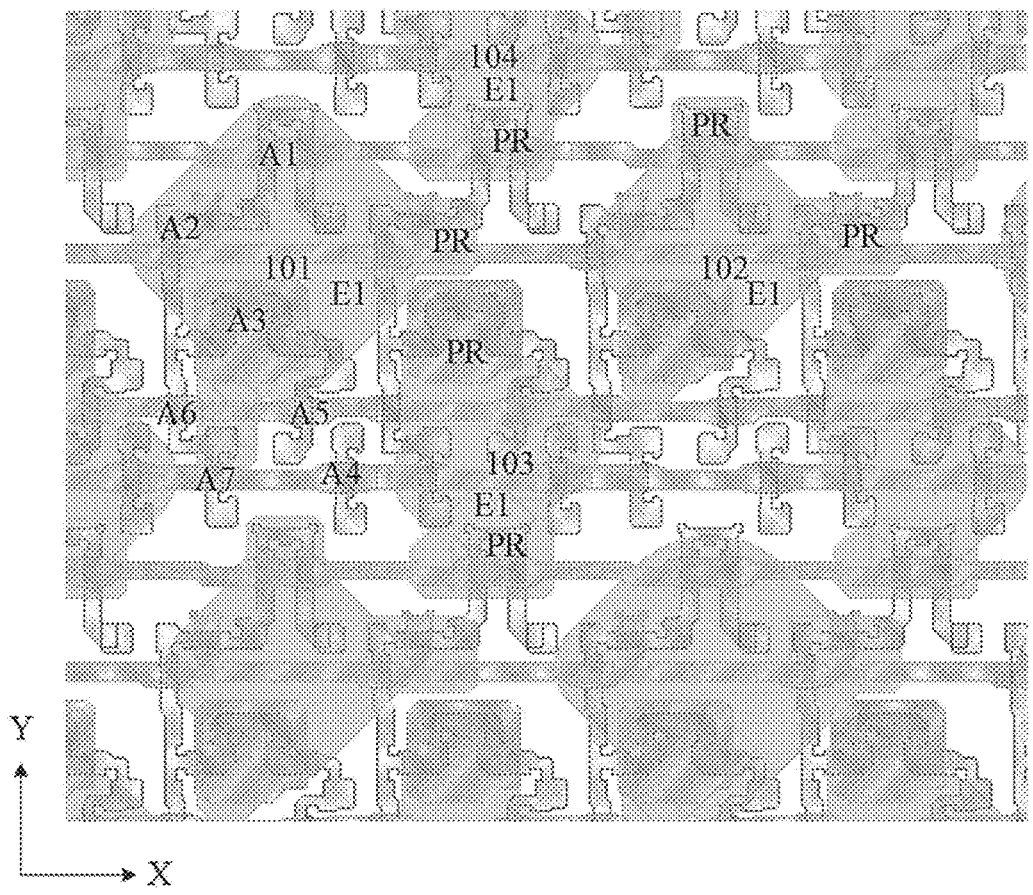
Figure 29:
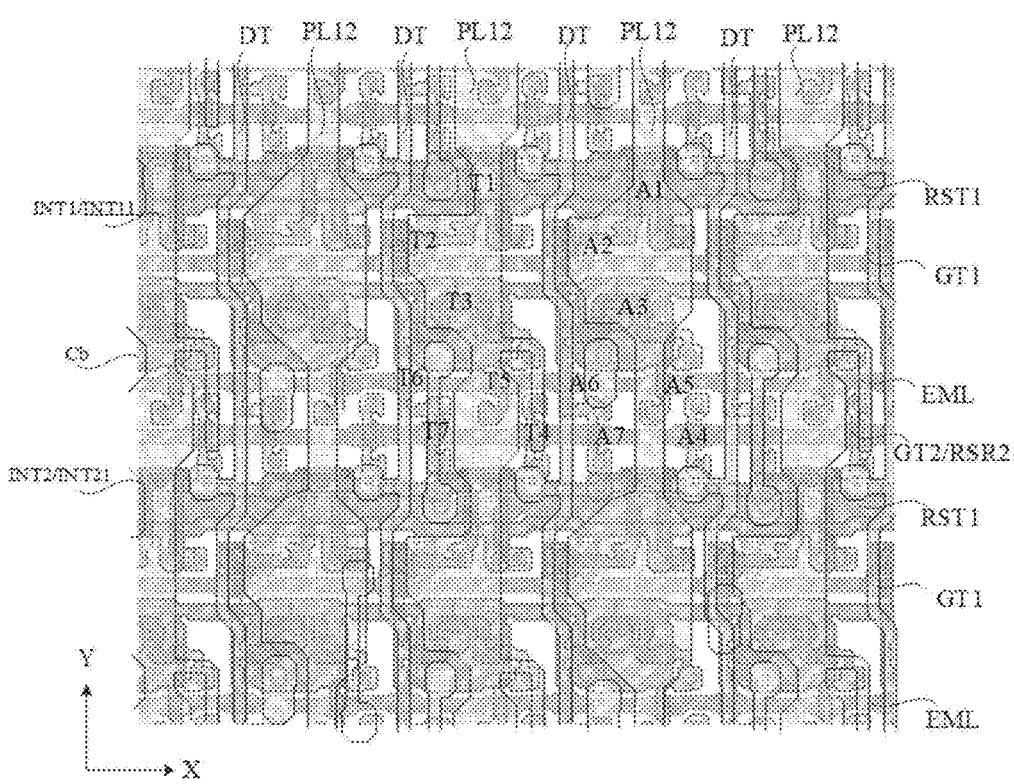
Figure 30:
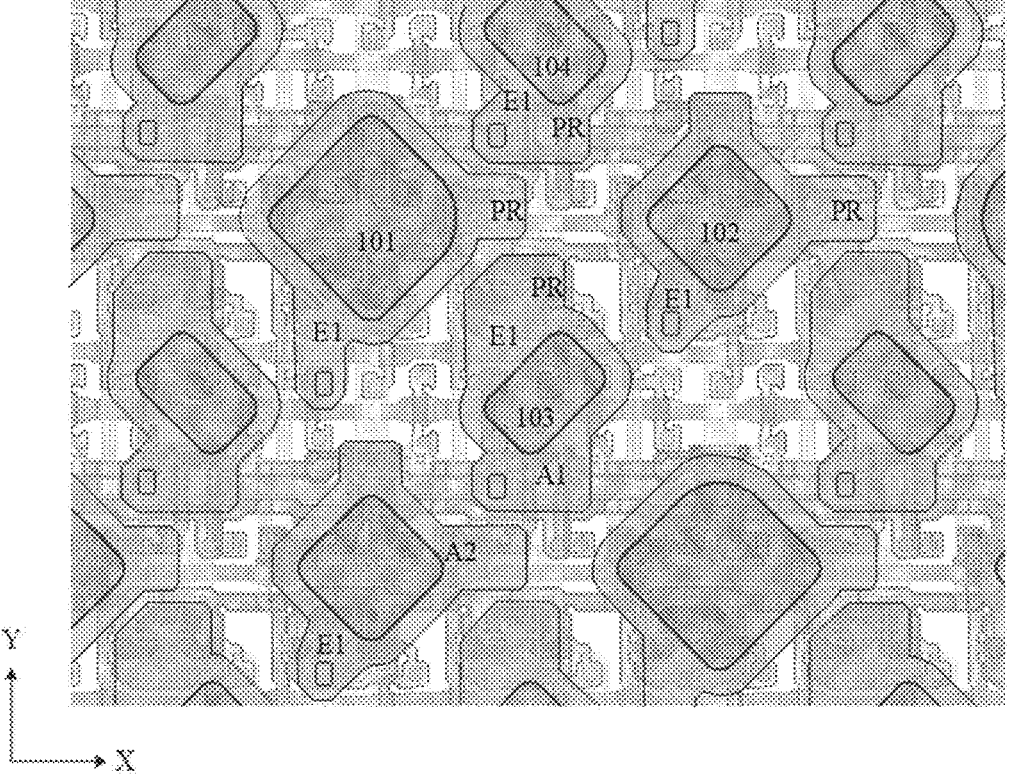

FIG. 22 is a plan view of a conductive pattern layer LY4 in a display panel provided by an embodiment of the present disclosure. FIG. 23 is a plan view of a pixel defining layer PDL in a display panel provided by an embodiment of the present disclosure. FIG. 24 is a plan view of an electrode pattern layer LY5 in a display panel provided by an embodiment of the present disclosure. FIG. 25A is a schematic diagram of a stack of a conductive pattern layer LY4 and a via hole structure VH3 in a display panel provided by an embodiment of the present disclosure. FIG. 25B is a schematic diagram of a stack of a conductive pattern layer LY4, a via hole structure VH3 and an electrode pattern layer LY5 in a display panel provided by an embodiment of the present disclosure. FIG. 26 is a schematic diagram of a stack of an electrode pattern layer LY5 and a pixel defining layer PDL in a display panel provided by an embodiment of the present disclosure. FIG. 27 is a schematic diagram of a stack of an active pattern layer M0, a conductive pattern layer LY1, a conductive pattern layer LY4, and a via hole structure VH3 in a display panel provided by an embodiment of the present disclosure. FIG. 28 is a schematic diagram of a stack of an active pattern layer M0, a conductive pattern layer LY1, and an electrode pattern layer LY5 in a display panel provided by an embodiment of the present disclosure. FIG. 29 is a schematic diagram of a stack of an active pattern layer M0, a conductive pattern layer LY1, a conductive pattern layer LY2, a via hole structure VH1, a conductive pattern layer LY4, and a via hole structure VH3 in a display panel provided by an embodiment of the present disclosure. FIG. 30 is a schematic diagram of a stack of an active pattern layer M0, a conductive pattern layer LY1, a conductive pattern layer LY2, a via hole structure VH1, a conductive pattern layer LY4, an electrode pattern layer LY5, and a pixel defining layer PDL in a display panel provided by an embodiment of the present disclosure.

Referring to FIG. 3-FIG. 30, an embodiment of the present disclosure provides a display panel, which includes: a base substrate BS, a pixel circuit 100a, and a light-emitting element 100b.

As shown in FIG. 3-FIG. 30, the pixel circuit 100a is located on the base substrate BS and includes a driving transistor T3, a threshold compensation transistor T2, and a data writing transistor. The threshold compensation transistor T2 is configured to perform threshold compensation on the driving transistor T3.

As shown in FIG. 3-FIG. 30, the display panel further includes a gate line GT1 and a scan line GT2, and the gate line GT1 is connected to the gate electrode T2g of the threshold compensation transistor T2 and extends along the direction X; the scan line GT2 is connected to the gate electrode T4g of the data writing transistor T4 and extends along the direction X, the first electrode T2a of the threshold compensation transistor T2 is connected to the first electrode T3a of the driving transistor T3, the second electrode T2b of the threshold compensation transistor T2 is connected to the gate electrode T3g of the driving transistor T3, the data writing transistor T4 is connected to the second electrode T3b of the driving transistor T1, the gate line GT1 and the scan line GT2 are arranged along the direction Y, the direction X intersects with the direction Y, the gate line GT1 is different from the scan line GT2, and the active layer A4 of the data writing transistor T4 is located on a side of the active layer A3 of the driving transistor T3 away from the active layer A2 of the threshold compensation transistor T2 in the direction Y.

For example, the material of the active layer A2 of the threshold compensation transistor T2 includes low-temperature poly-silicon (LTPS).

In the display panel provided by the embodiment of the present disclosure, the gate line GT1 and the scan line GT2 are different, so that the data writing transistor T4 and the threshold compensation transistor T2 are independently controlled, and the gate line GT1 and the scan line GT2 can be respectively input with signals, so that the low-level duration of the threshold compensation transistor T2 can be prolonged, and the turn-on duration of the threshold compensation transistor T2 can be prolonged, thereby prolonging the threshold compensation duration of the driving transistor T3 and improving the threshold compensation effect.

For example, the data writing transistor T4 and the threshold compensation transistor T2 may not be turned on at the same time and may not be turned off at the same time.

For example, when the data writing transistor T4 is turned on, the threshold compensation transistor T2 is turned off.

In the display panel provided by the embodiment of the present disclosure, when the data writing transistor T4 is turned on, the threshold compensation transistor T2 can be turned off to adjust the hysteresis of the driving transistor T3, which is beneficial to improving the display quality during low-frequency display.

For example, in some embodiments, after the data signal is written into the second electrode T3$b$ of the driving transistor T3 through the data writing transistor T4, the gate electrode of the driving transistor T3 can be continuously reset through the reset transistor T1, so that the reset duration of the gate electrode of the driving transistor T3 can be prolonged.

In the display panel provided by the embodiment of the present disclosure, the gate line GT1 and the scan line GT2 are different, and the data writing transistor T4 and the threshold compensation transistor T2 can be independently controlled, so that display defects such as afterimage and smearing, etc., can be avoided or eliminated, and the display quality can be improved. For example, the mode that the data writing transistor T4 and the threshold compensation transistor T2 can be independently controlled can make the gate electrode T3$g$ of the driving transistor T3 have a long reset duration, and the source electrode and drain electrode of the driving transistor T3 can be reset, so that the driving transistor T3 have a long threshold compensation duration, and the hysteresis state or bias voltage of the driving transistor T3 can be adjusted in a skip frame.

As shown in FIG. 3-FIG. 30, the light-emitting element 100$b$ includes a first electrode E1, a second electrode E2, and a light-emitting functional layer FL located between the first electrode E1 and the second electrode E2, and the first electrode E1 is closer to the base substrate BS than the second electrode E2.

As shown in FIG. 3, FIG. 14-FIG. 16 and FIG. 28, the pixel circuit 100$a$ further includes a reset transistor T1 connected to the gate electrode T3$g$ of the driving transistor T3. The reset transistor T1 is configured to reset the gate electrode T3$g$ of the driving transistor T3. The reset transistor T1 includes an active layer A1, the threshold compensation transistor T2 includes an active layer A2, the orthographic projection of the first electrode E1 of the light-emitting element 100$b$ on the base substrate BS overlaps with the orthographic projection of the active layer A1 on the base substrate BS, and the orthographic projection of the first electrode E1 of the light-emitting element 100$b$ on the base substrate BS overlaps with the orthographic projection of the active layer A2 on the base substrate BS.

In the display panel provided by the embodiment of the present disclosure, the first electrode E1 of the light-emitting element 100$b$ overlaps with the active layer A1 and the active layer A2, so that the active layer A1 and the active layer A2 can be prevented from being affected by illumination, thus avoiding affecting the characteristics of the reset transistor T1 and the threshold compensation transistor T2, alleviating the problem of turning red or pink during display, and alleviating the problem of flickering problem caused by illumination.

Of course, in other embodiments, the first electrode E1 of the light-emitting element 100$b$ may overlap with one of the active layer A1 and the active layer A2.

For example, the orthographic projection of the first electrode E1 of the light-emitting element 100$b$ on the base substrate BS covers the orthographic projection of at least one of the active layer A1 and the active layer A2 on the base substrate BS.

For example, as shown in FIG. 14, the active layer A1 includes a channel A11 and a channel A12, the channel A11 and the channel A12 are connected through a conductive portion P1, the active layer A2 includes a channel A21 and a channel A22, and the channel A21 and the channel A22 are connected through a conductive portion P2.

As shown in FIG. 7, FIG. 17 and FIG. 27, the second conductive line PL12 includes a protrusion P12 protruding along the direction X, and the orthographic projection of the protrusion P12 on the base substrate overlaps with the orthographic projection of at least one of the channels A11 and A12 of the active layer A1 of the reset transistor T1 on the base substrate, so as to further shield the at least one of the channels A11 and A12 of the active layer A1.

As shown in FIG. 7, FIG. 17 and FIG. 27, the orthographic projection of the projection P12 on the base substrate overlaps with the orthographic projection of at least one of the channels A21 and A22 of the active layer A2 of the threshold compensation transistor T2 on the base substrate, so as to further shield the at least one of the channels A21 and A22 of the active layer A2.

For example, the patterns of the conductive pattern layer LY4 in FIG. 27, FIG. 29 and FIG. 30 are the same as those of the conductive pattern layer LY4 shown in FIG. 22. For example, the patterns of the electrode pattern layer LY5 in FIG. 30 are the same as those of the electrode pattern layer LY5 in FIG. 28. For example, the boundary of the first electrode E1 in the electrode pattern layer LY5 in FIG. 30 can refer to the boundary of the first electrode E1 in the electrode pattern layer LY5 in FIG. 28.

For example, the orthographic projection of the first electrode E1 of the light-emitting element 100$b$ on the base substrate BS overlaps with the orthographic projection of at least one of the conductive portion P1 and the conductive portion P2 on the base substrate BS.

In the display panel provided by the embodiment of the present disclosure, the first electrode E1 overlaps with the conductive portion P1 and the conductive portion P2, so that the voltage on the conductive portion P1 and the voltage on the conductive portion P2 can be stabilized and voltage jump can be avoided. Of course, the embodiment of the present disclosure is not limited thereto. In other embodiments, the first electrode E1 does not overlap with at least one of the conductive portion P1 and the conductive portion P2.

For example, the orthographic projection of the first electrode E1 of the light-emitting element 100$b$ on the base substrate BS covers the orthographic projection of the conductive portion P1 on the base substrate BS, and the orthographic projection of the first electrode E1 of the light-emitting element 100$b$ on the base substrate BS covers the orthographic projection of the conductive portion P2 on the base substrate BS. Of course, the embodiment of the present disclosure is not limited thereto. In other embodiments, the first electrode E1 does not cover at least one of the conductive portion P1 and the conductive portion P2.

For example, referring to FIG. 5, FIG. 11 and FIG. 12-FIG. 16, the display panel further includes a light-emitting control signal line EML, the pixel circuit 100$a$ further includes a light-emitting control transistor T5 and a data writing transistor T4, the orthographic projection of the light-emitting control signal line EML on the base substrate BS overlaps with the orthographic projection of the active layer A5 of the light-emitting control transistor T5 on the base substrate BS, the light-emitting control transistor T5 and the data writing transistor T4 are connected through a conductive connection component C1, and the orthographic projection of the light-emitting control signal line EML on the base substrate BS overlaps with the orthographic projection of the conductive connection component C1 on the base substrate BS.

In the display panel provided by the embodiment of the present disclosure, because the data writing transistor T4 and the threshold compensation transistor T2 are driven separately, the active layer A4 of the data writing transistor T4 needs to be separated, and the data writing transistor T4 bypasses the light-emitting control signal line EML (bypasses the lateral driving signal of the light-emitting control transistor T5) by using the conductive connection component C1 as a jumper.

For example, referring to FIG. 5, FIG. 11 and FIG. 12-FIG. 16, the conductive connection component C1 and the active layer A5 of the light-emitting control transistor T5 are located in different layers. The active layer A5 is located in the active pattern layer M0, and the conductive connection component C1 is located in the conductive pattern layer LY3.

For example, the material of the conductive connection component C1 is different from the material of the active layer A5 of the light-emitting control transistor T5. For example, the material of the conductive connection component C1 includes a conductive material, and the material of the active layer A5 includes a semiconductor. Further, for example, the material of the conductive connection component C1 includes metal, and the material of the active layer A5 includes poly-silicon.

FIG. 14 shows the active layer A1 of the reset transistor T1, the active layer A2 of the threshold compensation transistor T2, the active layer A3 of the driving transistor T3, the active layer A4 of the data writing transistor T4, the active layer A5 of the light-emitting control transistor T5, the active layer A6 of the light-emitting control transistor T6, and the active layer A7 of the reset transistor T7.

In the embodiment of the present disclosure, the active layer of a transistor refers to the channel of the transistor. The material of the active layer (channel) of the transistor is a semiconductor material with semiconductor characteristics.

For example, referring to FIG. 12-FIG. 16, one end of the conductive connection component C1 is connected to the data writing transistor T4 through a via hole V1, and the other end of the conductive connection component C1 is connected to the light-emitting control transistor T5 through a via hole V2.

For example, referring to FIG. 3, FIG. 5 and FIG. 11-FIG. 16, the display panel further includes a scan line GT2, the scan line GT2 is connected to the gate electrode T4g of the data writing transistor T4, and the via hole V1 is located between the light-emitting control signal line EML and the scan line GT2. For example, the scan line GT2 and the gate electrode T4g are of an integral structure.

For example, referring to FIG. 12-FIG. 16, the via hole V2 is located between the light-emitting control signal line EML and the gate line GT1.

For example, referring to FIG. 12-FIG. 16, the orthographic projection of the light-emitting control signal line EML on the base substrate BS does not overlap with the orthographic projection of the data writing transistor T4 on the base substrate BS. Therefore, the data writing transistor T4 bypasses the light-emitting control signal line EML (bypasses the lateral driving signal of the light-emitting control transistor T5).

For example, referring to FIG. 4, FIG. 11 and FIG. 12-FIG. 16, a pixel circuit of the display panel includes an active pattern M1 and an active pattern M2, the active pattern M1 includes the active layer A1, the active layer A2, the active layer A3, the active layer A5, and the active layer A6, the active pattern M2 includes the active layer A4, and the active pattern M1 and the active pattern M2 are spaced apart from each other. Of course, in other embodiments, the active pattern M1 includes at least one of the active layer A1, the active layer A2, the active layer A3, the active layer A5 and the active layer A6. As shown in FIG. 14, the active layers A1-A6 are portions of the active pattern layer M0 covered by the conductive pattern layer LY1. As shown in FIG. 14, a portion of the active pattern layer M0 that is not covered by the conductive pattern layer LY1 is conductive, i.e., a conductor, which can be called a conductor portion and can serve as the first electrode or second electrode of the transistor.

It should be noted that the transistors used in the embodiments of the present disclosure can all be thin film transistors or field effect transistors or other switching elements with the same characteristics. The source electrode and the drain electrode of the transistor used here can be symmetrical in structure, so there can be no difference in structure between the source electrode and the drain electrode. In the embodiment of the present disclosure, in order to distinguish the two electrodes of the transistor other than the gate electrode, one electrode is directly described as the first electrode while the other electrode as the second electrode, so the first electrode and the second electrode of all or part of the transistors in the embodiments of the present disclosure can be interchanged as needed. For example, the first electrode of the transistor described in the embodiment of the present disclosure may be the source electrode and the second electrode may be the drain electrode; alternatively, the first electrode of the transistor is the drain electrode and the second electrode is the source electrode.

For example, as shown in FIG. 3, the display panel further includes a storage capacitor Cst and a first power line PL1, a first electrode plate Ca of the storage capacitor Cst is connected to the gate electrode T3g of the driving transistor T3, a second electrode plate Cb of the storage capacitor Cst is connected to the first power line PL1, and the first power line PL1 is configured to provide a first power voltage to the pixel circuit 100a. The first power voltage is the first voltage signal VDD.

For example, as shown in FIG. 7 and FIG. 8, the first power line PL1 includes a first conductive line PL11 and a second conductive line PL12, the first conductive line PL11 is closer to the base substrate BS than the second conductive line PL12, and the first conductive line PL11 is connected to the second conductive line PL12.

As shown in FIG. 7 and FIG. 8, the first conductive line PL11 is located in the conductive pattern layer LY3, and the second conductive line PL12 is located in the conductive pattern layer LY4. Referring to FIG. 7, FIG. 8 and FIG. 21A, when manufacturing a display panel, the conductive pattern layer LY3 is formed first, then an insulating layer 604 is formed, and then the conductive pattern layer LY4 is formed on the insulating layer 604. Components in the conductive pattern layer LY3 are formed before components in the conductive pattern layer LY4, so the first conductive line PL11 in the conductive pattern layer LY3 is closer to the base substrate BS than the second conductive line PL12 in the conductive pattern layer LY4.

As shown in FIG. 7, FIG. 8 and FIG. 13, the first conductive line PL11 and the second conductive line PL12 are connected through a via hole. As shown in FIG. 13, the first conductive line PL11 and the second conductive line PL12 are connected through a via hole Vb.

For example, as shown in FIG. 17 and FIG. 20, in the display panel, the first conductive line PL11 extends along the direction Y, and a plurality of first conductive lines PL11 are arranged along the direction X. At least one first conductive line PL11 includes a plurality of sub-lines PLa disconnected along the direction Y, and the direction Y intersects with the direction X.

For example, as shown in FIG. 13, in the display panel, the first conductive line PL11 and the block BK are connected through a via hole. As shown in FIG. 13, the first conductive line PL11 and the block BK are connected through a via hole V8. This arrangement manner of the block BK makes the wiring more convenient.

For example, as shown in FIG. 11 and FIG. 13, the orthographic projection of the block BK on the base substrate overlaps with the orthographic projection of the conductive portion P2 on the base substrate. The block BK and the conductive portion P2 form a capacitor (stabilizing capacitor), and the block BK plays a role in stabilizing the voltage on the conductive portion P2.

As shown in FIG. 24 and FIG. 26, due to process limitations, two adjacent first electrodes E1 have a minimum spacing, and in this case, the channels of the reset transistor T1 and the threshold compensation transistor T2 may not be completely shielded. As shown in FIG. 14 and FIG. 29, the first power line PL1 (the second conductive line PL12) is used for further shielding in order to avoid the influence of illumination on the characteristics of the transistors and improve the problem of turning red or pink. As shown in FIG. 29, the orthographic projection of the first power line PL1 (the second conductive line PL12) on the base substrate BS overlaps with the orthographic projection of the active layer A2 of the threshold compensation transistor T2 on the base substrate BS. As shown in FIG. 29, the orthographic projection of the first power line PL1 (the second conductive line PL12) on the base substrate BS overlaps with the orthographic projection of at least one of the active layer A1 of the reset transistor T1 and the active layer A2 of the threshold compensation transistor T2 on the base substrate BS. For example, as shown in FIG. 22 and FIG. 27, in the display panel, the orthographic projection of the first power line PL1 (the second conductive line PL12) on the base substrate BS overlaps with the orthographic projection of the active layer A1 on the base substrate BS, and overlaps with the orthographic projection of the active layer A2 on the base substrate BS. FIG. 29 is illustrated by taking the example that the orthographic projection of the first power line PL1 (the second conductive line PL12) on the substrate BS overlaps with the orthographic projection of the active layer A1 of the reset transistor T1 and the active layer A2 of the threshold compensation transistor T2 on the base substrate BS.

For example, in order to stabilize the voltage of the node N1 and improve the display effect, as shown in FIG. 22 and FIG. 27, the orthographic projection of the first power line PL1 (the second conductive line PL12) on the base substrate BS overlaps with the orthographic projection of the active layer A3 of the driving transistor T3 on the base substrate BS.

For example, as shown in FIG. 3-FIG. 30, the display panel further includes a first initialization line INT1 and a second initialization line INT2, the pixel circuit 100a further includes a reset transistor T7, the reset transistor T7 is connected to the first electrode E1 of the light-emitting element 100b, the first initialization line INT1 is connected to the reset transistor T1, and the second initialization line INT2 is connected to the reset transistor T7.

For example, as shown in FIG. 6, FIG. 7, FIG. 12 and FIG. 13, the first initialization line INT1 includes a first initialization signal line INT11 extending along the direction X and a first initialization connection line INT12 extending along the direction Y, the second initialization line INT2 includes a second initialization signal line INT21 extending along the direction X and a second initialization connection line INT22 extending along the direction Y, and the first initialization connection line INT12, the first power line PL11 and the second initialization connection line INT22 are sequentially arranged. As shown in FIG. 7, the first initialization connection line INT12, the first conductive line PL11, and the second initialization connection line INT22 are sequentially arranged along the direction X. As shown in FIG. 7, the first initialization connection line INT12, the first conductive line PL11 and the second initialization connection line INT22 are sequentially arranged adjacent to each other along the direction X. For example, the arrangement manner of the first initialization connection line INT12, the first conductive line PL11 and the second initialization connection line INT22 is not limited to that shown in FIG. 7. For example, on the basis of FIG. 7, the positions of the first initialization connection line INT12 and the second initialization connection line INT22 can be interchanged.

As shown in FIG. 12 and FIG. 13, the first initialization signal line INT11 and the first initialization connection line INT12 are connected through a via hole. As shown in FIG. 12 and FIG. 13, the first initialization signal line INT11 and the first initialization connection line INT12 are connected through a via hole V6.

As shown in FIG. 12 and FIG. 13, the second initialization signal line INT21 and the second initialization connection line INT22 are connected through a via hole. As shown in FIG. 12 and FIG. 13, the second initialization signal line INT21 and the second initialization connection line INT22 are connected through a via hole V10.

For example, as shown in FIG. 8, FIG. 13, FIG. 18A, FIG. 18B, FIG. 25A and FIG. 25B, in the display panel, the second conductive line PL12 has a main portion MP and a branch portion BR, the branch portion BR is branched from the main portion MP, and the orthographic projection of the first electrode E1 of the light-emitting element 100b on the base substrate BS overlaps with the orthographic projection of the main portion MP on the base substrate BS and overlaps with the orthographic projection of the branch portion BR on the base substrate BS. The main portion MP extends along the direction Y, and the main portion MP and the branch portion BR play the role of flattening the first electrode E1 of the light-emitting element 100b, thereby improving the flatness of the first electrode E1 to avoid color shift and improve the display quality.

For example, as shown in FIG. 8, FIG. 13, FIG. 18A, FIG. 18B, FIG. 22, FIG. 25A and FIG. 25B, the display panel further includes a flattening element FT, the orthographic projection of the first electrode E1 of the light-emitting element 100b on the base substrate BS overlaps with the orthographic projection of the flattening element FT on the base substrate BS, and the flattening element FT and the branch portion BR are respectively disposed on both sides of the main portion MP. The flattening element FT and the branch portion BR both play the role of flattening the first electrode E1 of the light-emitting element 100b, so as to avoid left-right color shift and improve the display quality.

For example, as shown in FIG. 8, FIG. 13, FIG. 18A, FIG. 18B, FIG. 22, FIG. 25A and FIG. 25B, the flattening element FT and the main portion MP are located in the same layer and arranged at intervals. In the embodiment of the present disclosure, because the flattening element FT is disposed on one side of the main portion MP, the branch portion BR is disposed on the other side of the main portion MP, so as to avoid left-right color shift and improve the display quality.

For example, as shown in FIG. 8, FIG. 13, FIG. 18A, FIG. 18B, FIG. 22, FIG. 25A and FIG. 25B, the width of the main portion MP is greater than the width of the branch portion BR.

For example, as shown in FIG. 8, FIG. 13, FIG. 18A, FIG. 18B, FIG. 22, FIG. 25A and FIG. 25B, the width of the main portion MP is greater than the width of the flattening element FT and is greater than the width of the flattening element FT in the direction X.

For example, as shown in FIG. 8, FIG. 13, FIG. 18A, FIG. 18B, FIG. 22, FIG. 25A and FIG. 25B, the flattening element FT is connected to the first electrode E1 of the light-emitting element through a via hole Vn.

In the embodiment of the present disclosure, the width of a component can refer to a size thereof in a direction perpendicular to its extension direction.

For example, as shown in FIG. 16, FIG. 24 and FIG. 28, in the display panel, the first electrode E1 of the light-emitting element 100$b$ has a protrusion PR, and the orthographic projection of the protrusion PR on the base substrate BS overlaps with the orthographic projection of at least one of the active layer A1 and the active layer A2 on the base substrate BS.

For example, as shown in FIG. 22 and FIG. 27, the orthographic projection of the branch portion BR on the base substrate BS overlaps with the orthographic projection of the active layer A4 on the base substrate BS. That is, the orthographic projection of the branch portion BR on the base substrate BS overlaps with the orthographic projection of the data writing transistor T4 on the base substrate BS.

For example, as shown in FIG. 22 and FIG. 27, the orthographic projection of the data line DT on the base substrate BS overlaps with the orthographic projection of the active layer A6 on the base substrate BS. That is, the orthographic projection of the data line DT on the base substrate BS overlaps with the orthographic projection of the light-emitting control transistor T6 on the base substrate BS.

Referring to FIG. 3, FIG. 4-FIG. 7, FIG. 12 and FIG. 13, one end of the conductive connection component C2 is connected to the gate electrode T3$g$ (first electrode plate Ca) of the driving transistor T3 through a via hole V4, and the other end of the conductive connection component C2 is connected to the second electrode T1$b$ of the reset transistor T1 (second electrode T2$b$ of the threshold compensation transistor T2) through a via hole V5.

Referring to FIG. 3, FIG. 4-FIG. 7, FIG. 12 and FIG. 13, one end of the conductive connection component C3 is connected to the second electrode T6$b$ of the light-emitting control transistor T6 through a via hole V13.

Referring to FIG. 13 and FIG. 16, the other end of the conductive connection component C3 is connected to the conductive connection component CEn through a via hole Vc.

Referring to FIG. 3, FIG. 4-FIG. 7, FIG. 12 and FIG. 13, one end of the conductive connection component C4 is connected to the first electrode T7$a$ of the reset transistor T7 through a via hole V11, and the other end of the conductive connection component C4 is connected to the second initialization signal line INT21 through a via hole V12.

Referring to FIG. 3, FIG. 4-FIG. 7, FIG. 12 and FIG. 13, one end of the conductive connection component C5 is connected to the first electrode T4$a$ of the data writing transistor T4 through a via hole V9.

Referring to FIG. 3, FIG. 4-FIG. 7, FIG. 12 and FIG. 13, the data line DT is connected to the other end of the conductive connection component C5 through a via hole Va.

Referring to FIG. 3, FIG. 4-FIG. 7, FIG. 12 and FIG. 13, one end of the conductive connection component C6 is connected to the first electrode T1$a$ of the reset transistor t1 through a via hole V7, and the other end of the conductive connection component C6 is connected to the first initialization signal line INT11 through a via hole V6.

Referring to FIG. 3, FIG. 13 and FIG. 17, the first conductive line PL11 is connected to the second electrode plate Cb of the storage capacitor Cst through a via hole V3. Thus, the first power line PL1 is connected to the second electrode plate Cb.

Referring to FIG. 3, FIG. 13 and FIG. 17, one end of the conductive connection component CEn is connected to the conductive connection component C3 through a via hole Vc.

Referring to FIG. 3, FIG. 13 and FIG. 17, the other end of the conductive connection component CEn is connected to the first electrode E1 of the light-emitting element through a via hole Vn.

Referring to FIG. 3, FIG. 13 and FIG. 17, one end of the conductive connection component CEm is connected to the conductive connection component C3 through a via hole Vd.

Referring to FIG. 3, FIG. 13, and FIG. 17, the other end of the conductive connection component CEm is connected to the first electrode E1 of the light-emitting element through a via hole Vm.

Referring to FIG. 13, the conductive connection component CEn and the conductive connection component CEm are connection components in different sub-pixels.

Referring to FIG. 3, FIG. 13, and FIG. 17, the first conductive line PL11 is connected to the first electrode T5$a$ of the light-emitting control transistor T5 through a via hole V14.

Referring to FIG. 3, FIG. 13, and FIG. 17, the conductive connection component C6 and the first initialization connection line INT12 are connected through the first initialization signal line INT11.

Referring to FIG. 3, FIG. 13, and FIG. 17, the conductive connection component C4 and the second initialization connection line INT22 are connected through the second initialization signal line INT21.

Referring to FIG. 3, FIG. 13, and FIG. 17, the second initialization signal line INT21 and the first electrode T7$a$ of the reset transistor T7 are connected through a via hole V15.

Referring to FIG. 3, FIG. 13, FIG. 16, FIG. 17 and FIG. 21B, the first initialization connection line INT12 and the first initialization signal line INT11 are connected through a via hole V16, and the first initialization connection line INT12 and the first electrode T1$a$ of the reset transistor T1 are connected through a via hole V17.

As shown in FIG. 7, FIG. 17, FIG. 20 and FIG. 21B, the first initialization connection line INT12 includes a conductive connection component 66, the first initialization signal line INT11 and the reset transistor T1 are connected through the conductive connection component 66, and the conductive connection component 66 is located between two adjacent sub-lines PLa.

Figure 31:
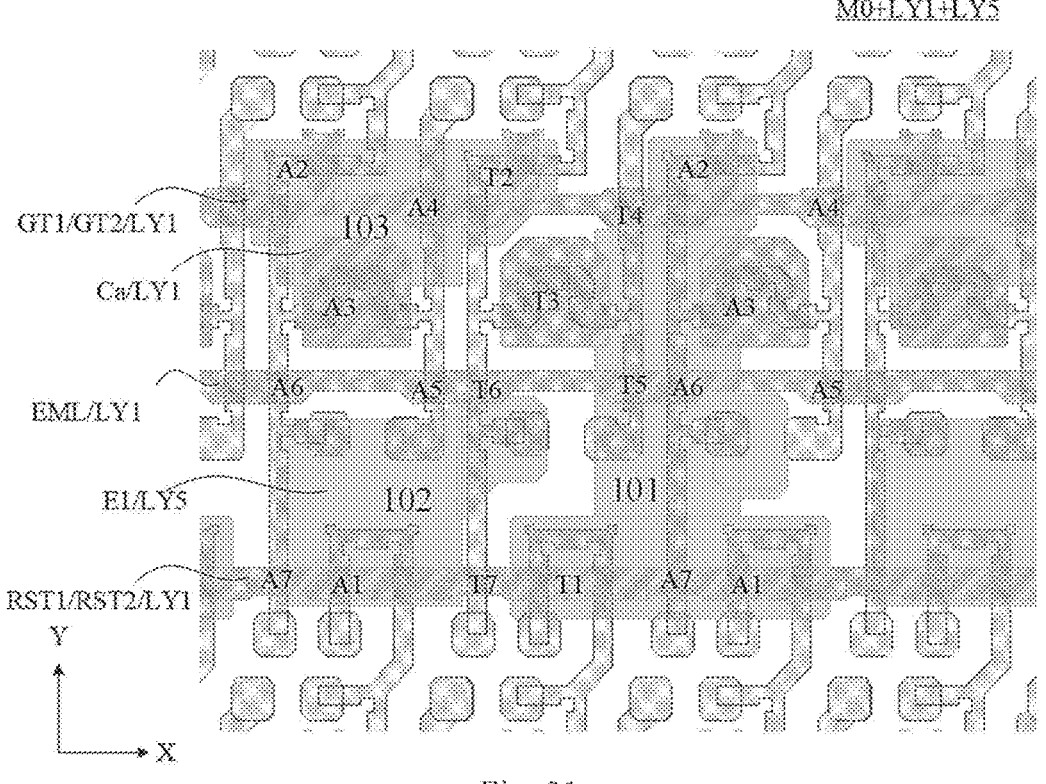
FIG. 31-FIG. 34 are plan views of stacked structures in a display panel provided by some embodiments of the present disclosure.

FIG. 31 is a schematic diagram of a stack of an active pattern layer M0, a conductive pattern layer LY1 and an electrode pattern layer LY5 in a display panel provided by an embodiment of the present disclosure.

Figure 32:
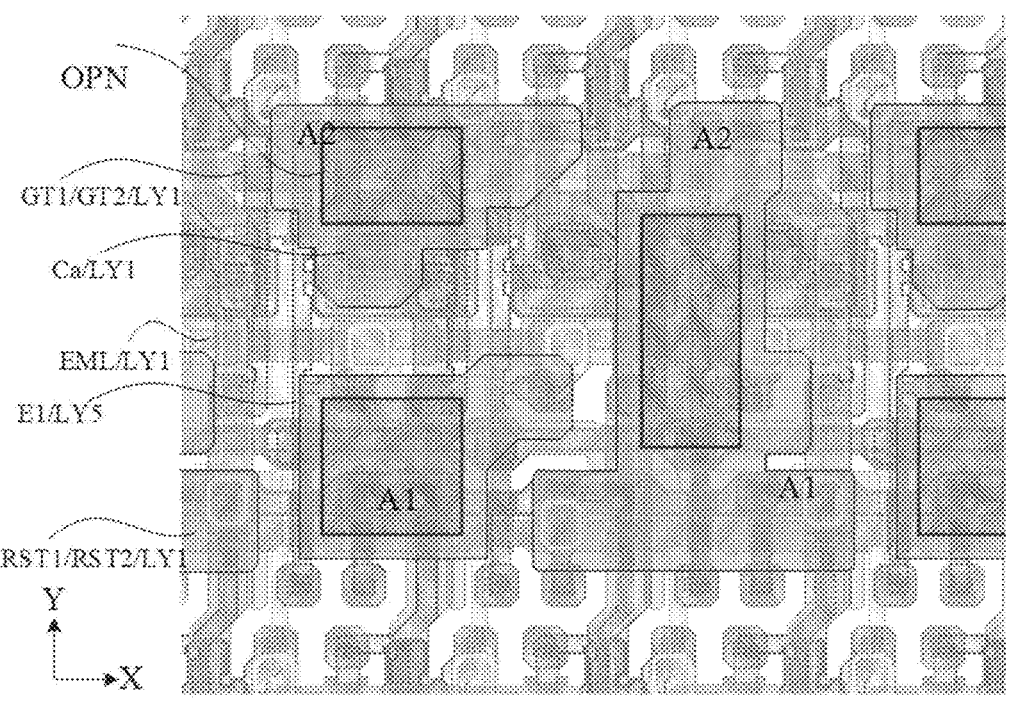

FIG. 32 is a schematic diagram of a stack of an active pattern layer M0, a conductive pattern layer LY1, a conductive pattern layer LY2, a via hole structure VH1, a conductive pattern layer LY3, a via hole structure VH2, a conductive pattern layer LY4, a via hole structure VH3, an electrode pattern layer LY5 and a pixel defining layer PDL in a display panel provided by an embodiment of the present disclosure.

Figure 33:
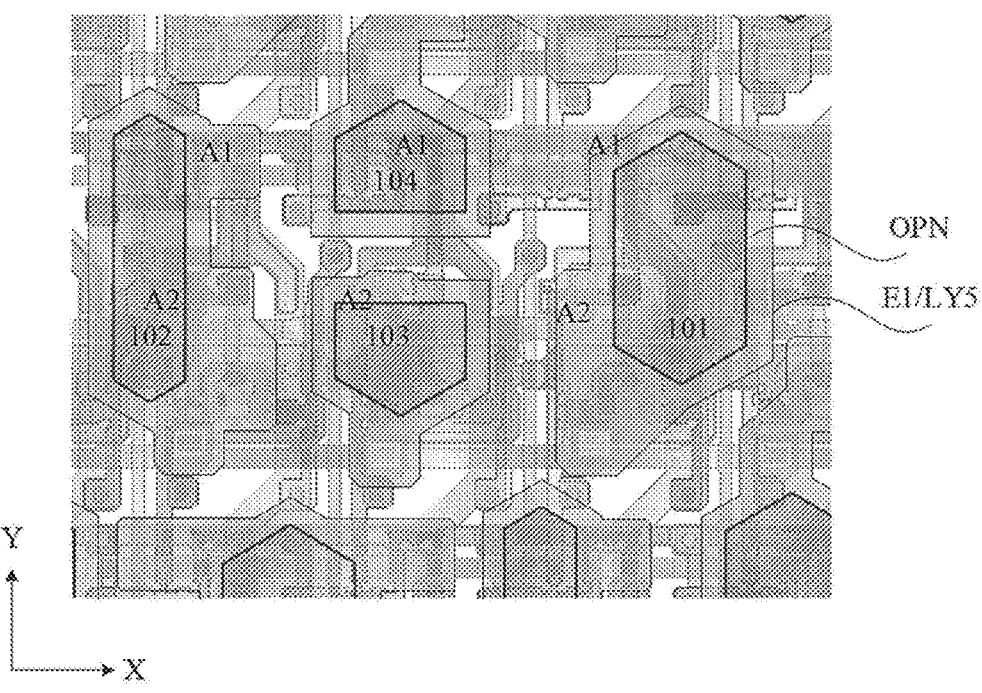

FIG. 33 is a schematic diagram of a stack of an active pattern layer M0, a conductive pattern layer LY1, a conductive pattern layer LY2, a via hole structure VH1, a conductive pattern layer LY3, a via hole structure VH2, a conductive pattern layer LY4, a via hole structure VH3, an electrode pattern layer LY5 and a pixel defining layer PDL in a display panel provided by an embodiment of the present disclosure.

Figure 34:
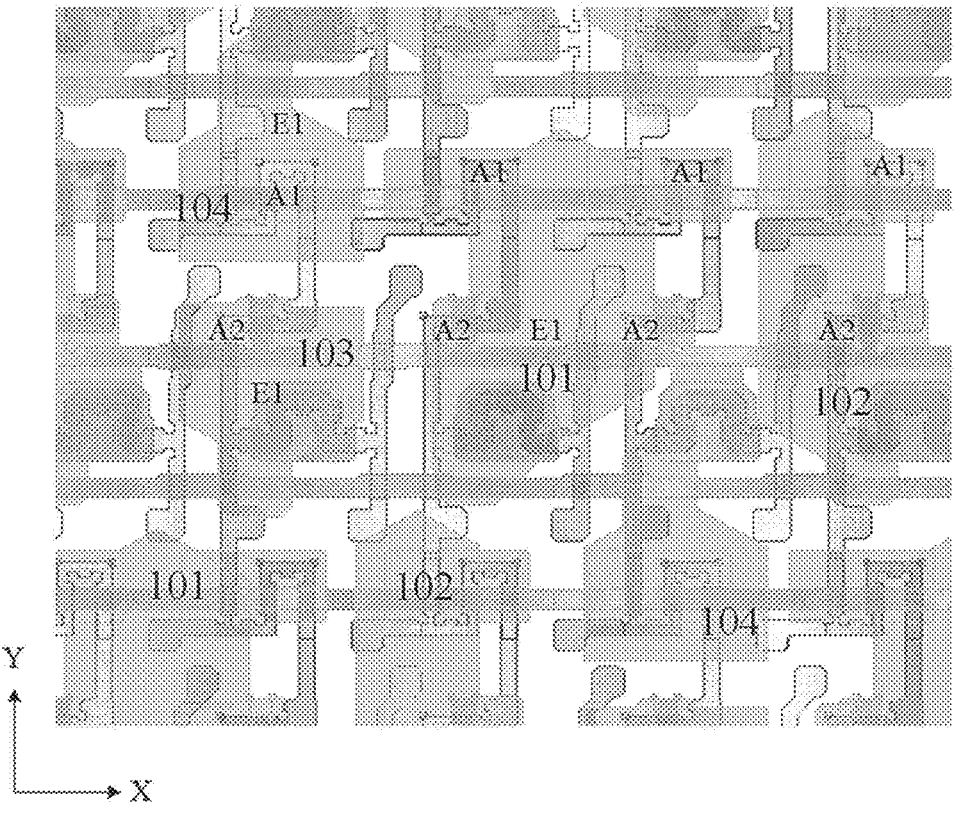

FIG. 34 is a schematic diagram of a stack of an active pattern layer M0, a conductive pattern layer LY1 and an electrode pattern layer LY5 in a display panel provided by an embodiment of the present disclosure.

The display panels shown in FIG. 31 and FIG. 32 are cases of real sub-pixels. The display panels shown in FIG. 33 and FIG. 34 are display panels with another pixel structure. The display panels shown in FIG. 31-FIG. 34 can also avoid the influence of illumination on the active layer A1 and the active layer A2, avoid the influence on the characteristics of the reset transistor T1 and the threshold compensation transistor T2, alleviate the problem of turning red or pink during display and alleviate the problem of flickering caused by illumination.

FIG. 31 and FIG. 32 are illustrated by taking the example that the orthographic projection of the first electrode E1 of the light-emitting element on the base substrate BS covers the orthographic projections of the active layer A1 and the active layer A2 on the base substrate. For example, in the embodiment of the present disclosure, the first electrode E1 has a protrusion PR at a rounded corner. The protrusion PR is provided to shield the active layer (channel).

For example, in the embodiment of the present disclosure, the first electrode E1 has a protrusion PR at a rounded corner, and the opening OPN has a rounded corner at the protrusion PR. The protrusion PR is provided to shield the active layer (channel).

For example, in the embodiment of the present disclosure, as shown in FIG. 26, FIG. 28 and FIG. 30, the first electrode E1 of the sub-pixel 101 has a protrusion PR at a rounded corner, and the protrusion PR is used to shield the channel of the threshold compensation transistor T2, so as to avoid that the channel of the threshold compensation transistor T2 is not shielded due to the rounded corner; and the opening OPN has a rounded corner at the protrusion PR. The protrusion PR is provided to shield the active layer (channel). The shape of the first electrode E1 of the light-emitting element in FIG. 30 can refer to that shown in FIG. 28.

As shown in FIG. 28 and FIG. 31-FIG. 34, in each of the sub-pixel 101, the sub-pixel 102, and the sub-pixel 103 in the display panel, the orthographic projection of the first electrode E1 of the light-emitting element on the base substrate covers the orthographic projections of the active layer A1 and the active layer A2 on the base substrate. That is, in each of the sub-pixel 101, the sub-pixel 102, and the sub-pixel 103 in the display panel, the orthographic projection of the first electrode E1 of the light-emitting element on the base substrate covers the orthographic projection of the active layer A1 on the base substrate and covers the orthographic projection of the active layer A2 on the base substrate.

As shown in FIG. 33 and FIG. 34, in each of the sub-pixel 101, the sub-pixel 102, the sub-pixel 103, and the sub-pixel

104 in the display panel, the orthographic projection of the first electrode E1 of the light-emitting element on the base substrate covers the orthographic projections of the active layer A1 and the active layer A2 on the base substrate. That is, in each of the sub-pixel 101, the sub-pixel 102, the sub-pixel 103, and the sub-pixel 104 in the display panel, the orthographic projection of the first electrode E1 of the light-emitting element on the base substrate covers the orthographic projection of the active layer A1 on the base substrate and covers the orthographic projection of the active layer A2 on the base substrate.

In the embodiment of the present disclosure, element A covering element B refers to that the element A completely covers the element B. The orthographic projection of element A on the base substrate covering the orthographic projection of element B on the base substrate refers to that the orthographic projection of element A on the base substrate completely covers the orthographic projection of element B on the base substrate.

Figure 35:
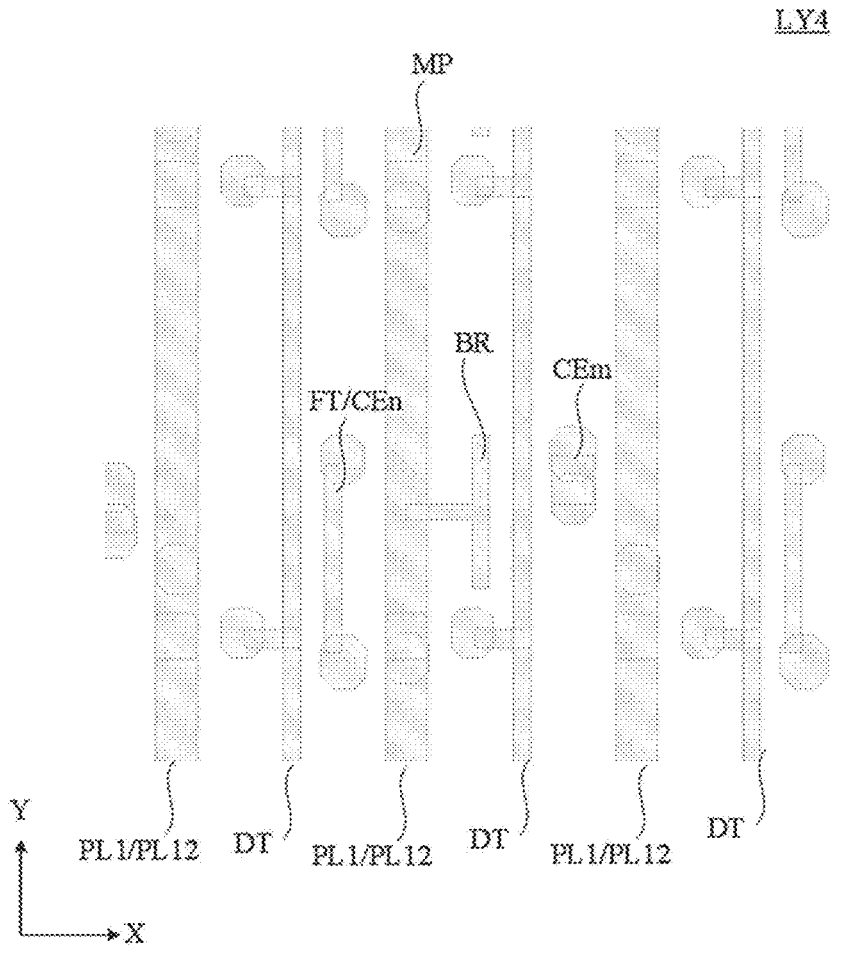
FIG. 35 is a plan view of a conductive pattern layer LY4 in a display panel provided by an embodiment of the present disclosure.

FIG. 35 is a plan view of a conductive pattern layer LY4 in a display panel provided by an embodiment of the present disclosure. Compared with the display panel shown in FIG. 8, in the display panel shown in FIG. 35, the shape of the branch portion BR is adjusted. As shown in FIG. 35, the branch portion BR is T-shaped. With this arrangement, the force on supporting the branch portion BR can be more balanced and the flatness of the first electrode E1 of the light-emitting element can be improved. As shown in FIG. 35, the branch portion BR includes a part extending along the direction X and a part extending along the direction Y, and the part of the branch portion BR extending along the direction Y is connected to the main portion MP through the part of the branch portion BR extending along the direction X. For example, the branch portion BR shown in FIG. 8 is 7-shaped.

Figure 36:
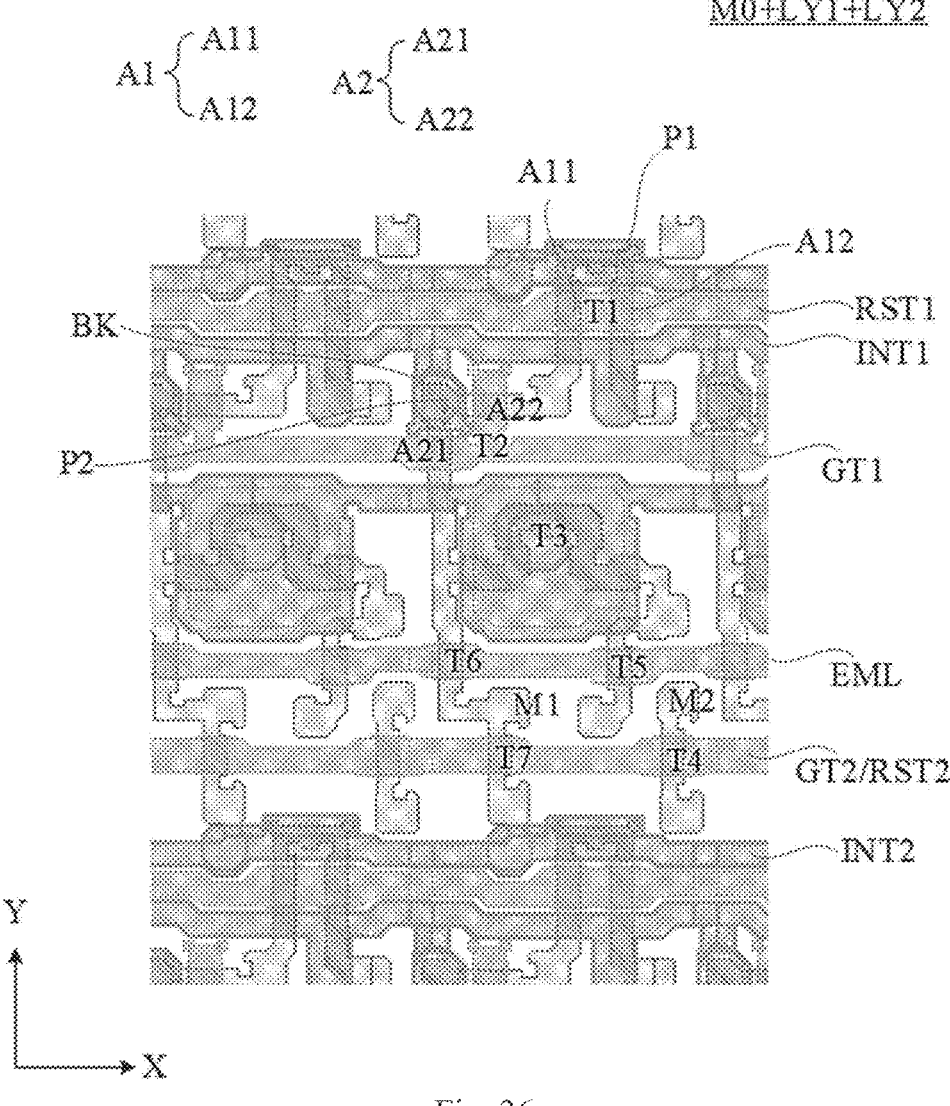
FIG. 36 is a schematic diagram of a stack of an active pattern layer M0, a conductive pattern layer LY1 and a conductive pattern layer LY2 in a display panel provided by an embodiment of the present disclosure.

FIG. 36 is a schematic diagram of a stack of an active pattern layer M0, a conductive pattern layer LY1 and a conductive pattern layer LY2 in a display panel provided by an embodiment of the present disclosure. Compared with the display panel shown in FIG. 11, in the display panel shown in FIG. 36, the first initialization signal line INT11 has a block BK, and the orthographic projection of the conductive portion P2 connected to two channels (channel A21 and channel A22) arranged at intervals in the active layer A2 of the threshold compensation transistor T2 overlaps with the orthographic projection of the block BK on the base substrate. This arrangement manner can also stabilize the voltage on the conductive portion P2.

An embodiment of the present disclosure further provides a display apparatus, which includes any of the above display panels.

For example, the display apparatus includes an OLED or a product including an OLED. For example, the display apparatus includes any product or component having display function and including the above display panel, such as a TV, a digital camera, a mobile phone, a watch, a tablet computer, a laptop computer, a navigator, etc.

The above description takes the pixel circuit 100*a* of 7T1C as an example, and the embodiment of the present disclosure includes but is not limited to this case. It should be noted that the embodiment of the present disclosure does not limit the number of thin film transistors and the number of capacitors included in the pixel circuit 100*a*. For example, in other embodiments, the pixel circuit 100*a* of the display panel can be a structure including other numbers of transistors, such as a 7T2C structure, a 6T1C structure, a 6T2C structure or a 9T2C structure, without being limited in the embodiment of the present disclosure. Of course, the display panel may also include a pixel circuit 100*a* with less than 7 transistors.

In the embodiment of the present disclosure, elements located in the same layer can be formed by using the same film layer through the same patterning process. For example, elements located in the same layer may be located on the surface of the same element away from the base substrate BS.

Some drawings show a direction Z, which is a direction perpendicular to the main surface of the base substrate. The main surface of the base substrate is the surface for manufacturing various components thereon. The upper surface of the base substrate in the cross-sectional view is the main surface of the base substrate. Both the direction X and the direction Y are directions parallel with the main surface of the base substrate. For example, the direction X intersects with the direction Y. Further, for example, the direction X is perpendicular to the direction Y. The direction Z is perpendicular to the direction X and perpendicular to the direction Y.

For example, the transistors in the pixel circuit of the embodiment of the present disclosure are all thin film transistors. For example, the conductive pattern layer LY1, the conductive pattern layer LY2, the conductive pattern layer LY3, and the conductive pattern layer LY4 are all made of metal materials. For example, the conductive pattern layer LY1 and the conductive pattern layer LY2 are formed of metal materials such as nickel and aluminum, etc., but are not limited thereto. For example, the conductive pattern layer LY3 and the conductive pattern layer LY4 are formed of materials such as titanium and aluminum, etc., but are not limited thereto. For example, the conductive pattern layer LY3 and the conductive pattern layer LY4 are respectively formed by three sub-layers of Ti/Al/Ti, but are not limited thereto. For example, the base substrate can be a glass substrate or a polyimide substrate, but it is not limited thereto and can be selected as needed. For example, the buffer layer BL, the barrier layer BA, the insulating layer 601, the insulating layer 602, the insulating layer 603, the insulating layer 604 and the insulating layer 605 are all made of insulating materials. For example, the material of the insulating layer 605 includes an organic insulating material, and the organic insulating material includes resin, but is not limited thereto. For example, the materials of the insulating layers 601, 602, 603 and 604 include inorganic insulating materials. For example, the inorganic insulating materials includes at least one of silicon oxide, silicon nitride and silicon oxynitride.

For example, the materials of the first electrode E1 and the second electrode E2 of the light-emitting element can be selected as needed. In some embodiments, the first electrode E1 can adopt at least one of transparent conductive metal oxide and silver, but is not limited thereto. For example, the first electrode E1 may adopt a structure in which three sub-layers of ITO-Ag-ITO are stacked. In some embodiments, the second electrode E2 can be made of a metal with a low work function, and at least one of magnesium and silver may be used, but it is not limited thereto.

The following statements need to be explained.

(1) Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components.

(2) In the drawings of the embodiments of the present disclosure, only the structures related to the embodiments of the present disclosure are involved, and other structures can refer to the common design(s).

(3) For the sake of clarity, in the drawings used to describe the embodiments of the present disclosure, the thickness of a layer or region is exaggerated. It can be understood that when an element such as a layer, film, region, or substrate is referred to as being "on" or "under" another element, the element can be "directly" "on" or "under" the other element, or there may be intermediate elements.

(4) In the case of no conflict, the features in the same embodiment and different embodiments of the present disclosure can be combined with each other.

The above are only specific embodiments of the present disclosure, but the protection scope of the present disclosure is not limited thereto. Any person skilled in the art can easily conceive of changes or substitutions within the technical scope disclosed in the present disclosure, and these changes or substitutions should be covered within the protection scope of the present disclosure. Therefore, the protection scope of the present disclosure should be subject to the protection scope of the claims.

The invention claimed is:

1. A display panel, comprising:
   a base substrate;
   a pixel circuit, located on the base substrate, and comprising a driving transistor, a threshold compensation transistor and a data writing transistor;
   a gate line, connected to a gate electrode of the threshold compensation transistor, and extending along a first direction; and
   a scan line connected to a gate electrode of the data writing transistor, and extending along the first direction,
   wherein a first electrode of the threshold compensation transistor is connected to a first electrode of the driving transistor, a second electrode of the threshold compensation transistor is connected to a gate electrode of the driving transistor, and the data writing transistor is connected to a second electrode of the driving transistor,
   a material of an active layer of the threshold compensation transistor comprises low-temperature poly-silicon,
   the gate line and the scan line are arranged along a second direction, the second direction intersects with the first direction, the gate line is different from the scan line,
   an active layer of the data writing transistor is located on a side of an active layer of the driving transistor away from the active layer of the threshold compensation transistor in the second direction.

2. The display panel according to claim 1, wherein the gate line and the scan line are disposed on both sides of the active layer of the driving transistor, respectively.

3. The display panel according to claim 1, further comprising a light-emitting element, wherein the pixel circuit is configured to drive the light-emitting element,
   the pixel circuit further comprises a first reset transistor connected to the gate electrode of the driving transistor;
   the light-emitting element comprises a first electrode, a second electrode, and a light-emitting functional layer located between the first electrode and the second electrode, and the first electrode of the light-emitting element is closer to the base substrate than the second electrode of the light-emitting element.

4. The display panel according to claim 3, wherein an orthographic projection of the first electrode of the light-emitting element on the base substrate overlaps with an orthographic projection of an active layer of the first reset transistor on the base substrate, and the orthographic projection of the first electrode of the light-emitting element on the base substrate overlaps with an orthographic projection of the active layer of the threshold compensation transistor on the base substrate.

5. The display panel according to claim 4, further comprising a light-emitting control signal line, wherein the pixel circuit further comprises a first light-emitting control transistor, an orthographic projection of the light-emitting control signal line on the base substrate overlaps with an orthographic projection of an active layer of the first light-emitting control transistor on the base substrate, the first light-emitting control transistor and the data writing transistor are connected through a first conductive connection component, and an orthographic projection of the light-emitting control signal line on the base substrate overlaps with an orthographic projection of the first conductive connection component on the base substrate.

6. The display panel according to claim 5, wherein the first conductive connection component and the active layer of the first light-emitting control transistor are located in different layers,
   wherein one end of the first conductive connection component is connected to the data writing transistor through a first via hole, and the other end of the first conductive connection component is connected to the first light-emitting control transistor through a second via hole,
   wherein the first via hole is located between the light-emitting control signal line and the scan line.

7. The display panel according to claim 5, wherein the orthographic projection of the light-emitting control signal line on the base substrate does not overlap with an orthographic projection of the data writing transistor on the base substrate.

8. The display panel according to claim 4, further comprising a storage capacitor and a first power line, wherein a first electrode plate of the storage capacitor is connected to the gate electrode of the driving transistor, a second electrode plate of the storage capacitor is connected to the first power line, and the first power line is configured to provide a first power voltage to the pixel circuit.

9. The display panel according to claim 8, wherein an orthographic projection of the first power line on the base substrate overlaps with the orthographic projection of the active layer of the first reset transistor on the base substrate, and overlaps with the orthographic projection of the active layer of the threshold compensation transistor on the base substrate.

10. The display panel according to claim 8, wherein the first power line comprises a first conductive line and a second conductive line, the first conductive line is closer to the base substrate than the second conductive line, and the first conductive line is connected to the second conductive line.

11. The display panel according to claim 10, wherein the second conductive line comprises a first protrusion protruding along the first direction, and an orthographic projection of the first protrusion on the base substrate overlaps with an orthographic projection of at least one of a first channel and a second channel of the active layer of the first reset transistor on the base substrate,
   wherein a plurality of first conductive lines are arranged along the first direction, and at least one first conductive line comprises a plurality of sub-lines disconnected along the second direction, and the second direction intersects with the first direction.

12. The display panel according to claim 10, further comprising a first initialization line and a second initialization line, wherein the pixel circuit further comprises a second reset transistor, the second reset transistor is connected to the first electrode of the light-emitting element, the first initialization line is connected to the first reset transistor, the second initialization line is connected to the second reset transistor, the first initialization line comprises a first initialization signal line extending along the first direction and a first initialization connection line extending along the second direction, the second initialization line comprises a second initialization signal line extending along the first direction and a second initialization connection line extending along the second direction, and the first initialization connection line, the first conductive line and the second initialization connection line are sequentially arranged adjacent to each other along the first direction.

13. The display panel according to claim 12, wherein the first initialization connection line comprises a second conductive connection component, the first initialization signal line and the first reset transistor are connected through the second conductive connection component, and the second conductive connection component is located between two adjacent sub-lines.

14. The display panel according to claim 12, wherein the first initialization signal line has a block, and an orthographic projection of a conductive portion connected to two channels arranged at intervals in the active layer of the threshold compensation transistor on the base substrate overlaps with an orthographic projection of the block on the base substrate.

15. The display panel according to claim 10, wherein the second conductive line has a main portion and a branch portion, the branch portion is branched from the main portion, the orthographic projection of the first electrode of the light-emitting element on the base substrate overlaps with an orthographic projection of the main portion on the base substrate, and overlaps with an orthographic projection of the branch portion on the base substrate.

16. The display panel according to claim 15, further comprising a flattening element, wherein the orthographic projection of the first electrode of the light-emitting element on the base substrate overlaps with an orthographic projection of the flattening element on the base substrate, and the flattening element and the branch portion are disposed on both sides of the main portion, respectively,
   wherein the flattening element and the main portion are in a same layer and arranged at intervals, the flattening element extends along the second direction, and the flattening element is connected to the first electrode of the light-emitting element through a third via hole,
   wherein a width of the main portion is greater than a width of the branch portion, and is greater than a width of the flattening element in the first direction.

17. The display panel according to claim 3, wherein an active layer of the first reset transistor comprises a first channel and a second channel, the first channel and the second channel are connected through a first conductive portion, the active layer of the threshold compensation transistor comprises a third channel and a fourth channel, and the third channel and the fourth channel are connected through a second conductive portion, wherein the orthographic projection of the first electrode of the light-emitting element on the base substrate covers an orthographic projection of at least one of the first conductive portion and the second conductive portion on the base substrate.

18. The display panel according to claim 17, wherein the orthographic projection of the first electrode of the light-emitting element on the base substrate overlaps with an orthographic projection of the first conductive portion on the base substrate, and the orthographic projection of the first electrode of the light-emitting element on the base substrate overlaps with an orthographic projection of the second conductive portion on the base substrate.

19. The display panel according to claim 3, wherein the first electrode of the light-emitting element has a second protrusion, and an orthographic projection of the second protrusion on the base substrate overlaps with an orthographic projection of at least one of an active layer of the first reset transistor and the active layer of the threshold compensation transistor on the base substrate.

20. A display apparatus, comprising the display panel according to claim 1.

\* \* \* \* \*